(12) United States Patent
Yahata et al.

(10) Patent No.: US 6,563,755 B2
(45) Date of Patent: May 13, 2003

(54) SEMICONDUCTOR MEMORY DEVICE

(75) Inventors: Hideharu Yahata, Inagi (JP); Masashi Horiguchi, Koganei (JP); Yoshinobu Nakagome, Hamura (JP); Yoshikazu Saitoh, Hamura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/986,082

(22) Filed: Nov. 7, 2001

(65) Prior Publication Data
US 2002/0057615 A1 May 16, 2002

(30) Foreign Application Priority Data

Nov. 10, 2000 (JP) .................................. 2000-343781
Sep. 27, 2001 (JP) .................................. 2001-297009

(51) Int. Cl.⁷ .............................. G11C 7/00; G11C 8/00
(52) U.S. Cl. ............. 365/222; 365/189.02; 365/230.02
(58) Field of Search ......................... 365/189.02, 194, 365/203, 230.02, 222

(56) References Cited

U.S. PATENT DOCUMENTS

| | | | | |
|---|---|---|---|---|
| 4,173,766 A | | 11/1979 | Hayes ................ | 365/185.01 |
| 4,631,701 A | * | 12/1986 | Kappeler et al. ....... | 365/222 |
| 5,251,176 A | * | 10/1993 | Komatsu .............. | 365/222 |
| 5,450,364 A | * | 9/1995 | Stephens et al. ....... | 365/222 |
| 6,011,725 A | | 1/2000 | Eitan ................. | 365/185.33 |
| 6,167,484 A | * | 12/2000 | Boyer et al. .......... | 365/222 |

FOREIGN PATENT DOCUMENTS

| | | |
|---|---|---|
| JP | 60-200566 | 3/1984 |
| JP | 61071494 | 9/1984 |
| JP | 6-90004 | 10/1991 |
| JP | 11-500559 | 2/1996 |
| WO | WO96/25741 | 2/1996 |

* cited by examiner

Primary Examiner—Trong Phan

(57) ABSTRACT

A semiconductor memory device realizing a reduced cycle time while improving the ease of use is to be provided. Where a memory cell requires a periodic refresh action to hold stored information, a time multiplexing mode of performing, when a first memory operation on any memory cell to read or write stored information or information to be stored and a second memory operation, having a different address designation from the first memory operation, or a refresh operation compete for the same time segment, the second memory operation before or after such first memory operation, wherein the minimum access time needed for the first memory operation and the second memory operation or the refresh operation performed before or after the first memory operation is set shorter than the sum of the length of time required for the first memory operation and that required for the second memory operation or the refresh operation on condition that sets of information stored in the memory cells are not mutually affected in the first memory operation and the second memory operation or the refresh operation.

23 Claims, 30 Drawing Sheets

FIG. 36
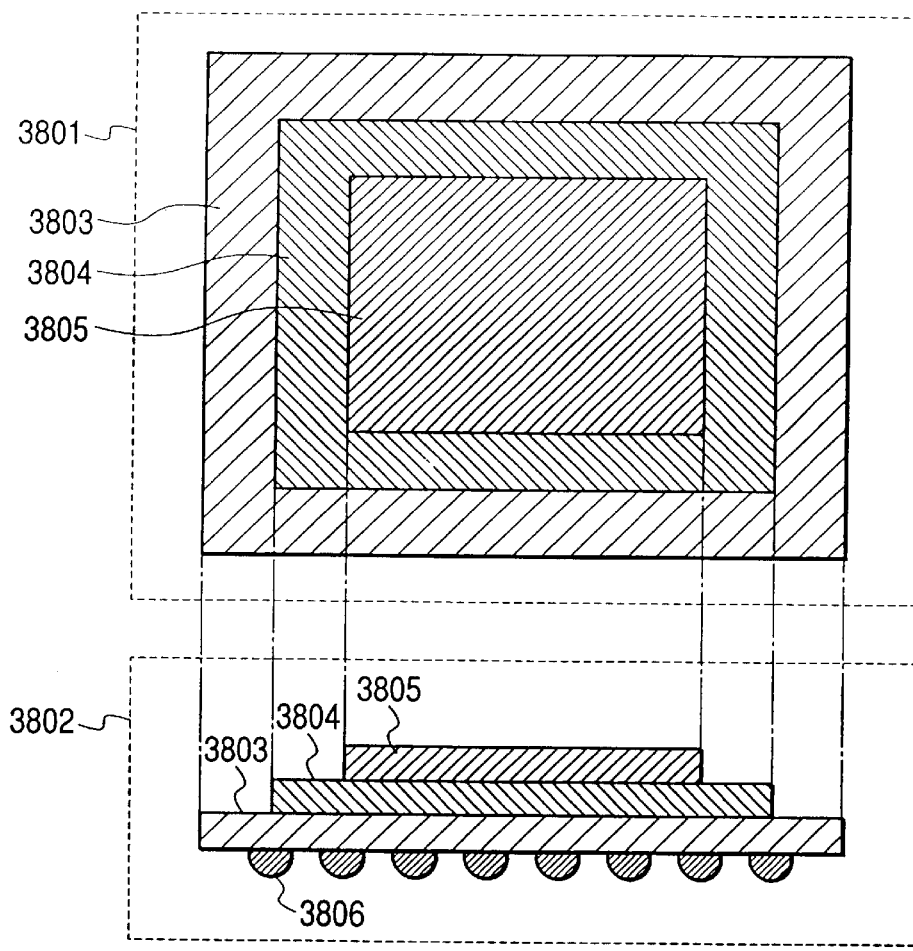
PRIOR ART FIG. 37
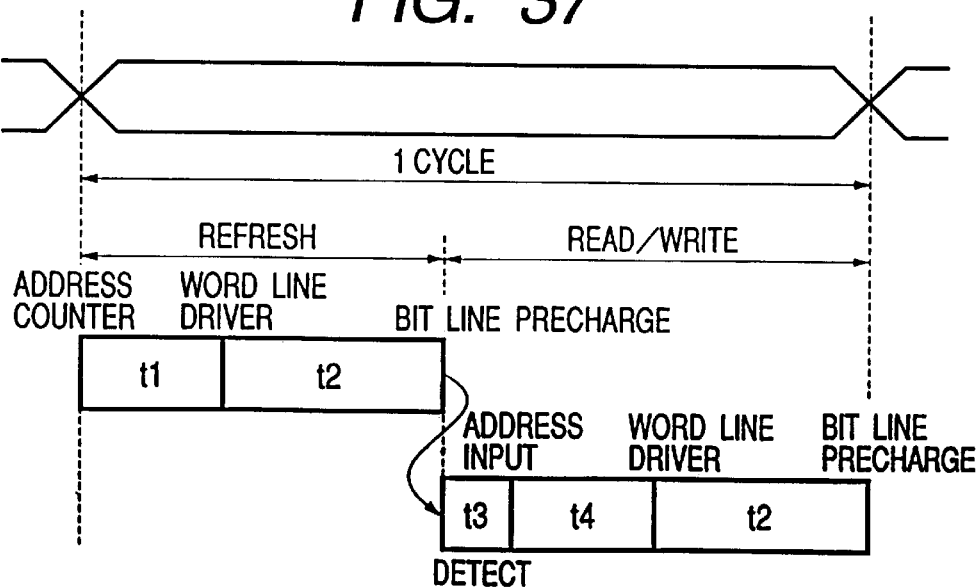

SEMICONDUCTOR MEMORY DEVICE

BACKGROUND OF THE INVENTION

The present invention relates to a semiconductor memory device requiring refresh operations, and mainly to a technique that can be effectively utilized in a dynamic random access memory (DRAM), in which a read/write operation mainly from outside and a refresh operation by an internal circuit are executed within a single memory cycle.

In order to enable a DRAM to be handled in the same way as a static random access memory (SRAM) is handled, Japanese Unexamined Patent Publication No. Sho 61(1986)-71494 proposes a so-called time-multiplexed type DRAM in which a read/write operation and a refresh operation are carried out in a single cycle by allocating a separate time segment for each as shown in FIG. 37 or the two operations are carried out only when a read/write operation and a refresh operation are competing with each other.

According to the timing chart of FIG. 37, the completion of the refresh operation accomplished in the first half is detected by the precharge of a bit line to switch over to the read/write operation. While the chart shows a case in which the refresh operation is performed in the first half, it is also stated in the reference that the read/write operation can as well be performed in the first half to be followed by the refresh operation in the latter half.

SUMMARY OF THE INVENTION

In the time-multiplexed system described above, the completion of the refresh operation accomplished in the first half of the cycle is detected by the stand-by state of nodes within the memory and, in response to that, an external address is accepted in the latter half of the cycle to perform a usual write or read operation thereby to prevent any erroneous operation in memory selection or destruction of information stored in any memory cell. Therefore, in this time-multiplexed system, the two operations are completely separated in a time sequence to prevent erroneous operations or the like, inevitably inviting a problem of an extended cycle time.

In the above-described DRAM, if the period of time in which a word line is placed in a non-selected state, the precharging of the bit line is completed and the bit line takes on a high impedance state is kept from overlapping the next word line selecting operation, information in any memory cell can be protected from destruction. Viewed the other way around, if the word line is placed in a selecting state in the latter half of the cycle when the bit line is being precharged in the former half of the cycle, the precharge voltage of the bit line will be written into the selected memory cell as well and information stored therein will be destroyed. Taking note of this problem, the present inventor though of shortening the memory cycle of a DRAM operating in the time-multiplexed system described above.

An object of the present invention is to provide a semiconductor memory device to realize high speed cycles while improving the ease of use. The above-stated and other objects and novel features of the invention will become apparent from the description in this specification and the accompanying drawings.

What follows is a brief summary of a typical aspect of the present invention disclosed in this application. Thus, memory cells periodically needing a refresh operation to hold stored information are provided with a time-multiplexing mode of performing, when a first memory operation on a memory cell to read or write stored information or information to be stored and performing a second memory operation, having a different address designation from the first memory operation, or a refresh operation compete for the same time segment, the second memory operation or the refresh operation before or after the first memory operation, wherein the minimum access time needed for the first memory operation and the second memory operation or the refresh operation performed before or after the first memory operation is set shorter than the sum of the length of time required for the first memory operation and that required for the second memory operation or the refresh operation on condition that sets of information stored in the memory cells be not mutually affected in the first memory operation and the second memory operation or the refresh operation.

According to another typical aspect of the invention disclosed in this application, there are provided a memory array comprising a plurality of memory cells disposed to match a plurality of bit lines and a plurality of word lines and periodically needing a refresh operation to hold stored information; a precharging circuit for precharging the bit lines; an address selecting circuit for selecting a specific word line out of the plurality of word lines and a specific bit line out of the plurality of bit lines in accordance with an address signal; and a time-multiplexing control circuit for allocating a time segment, when a first memory operation on the memory cell to read or write stored information or information to be stored is instructed, for performing a second memory operation or the refresh operation, having a different address designation from the first memory operation, after the first memory operation, wherein the time-multiplexing control circuit allocates time segments for a first operation to release the bit lines from the precharge in accordance with the instruction of the first memory operation and to read information in the memory cells or write external information into the memory cell by performing operations to select a word line and a bit line in accordance with the address signal in the first memory operation, a first precharge operation to precharge the bit lines again, and for the second memory operation or the refresh operation by releasing the bit lines from the precharge and select a word line matching the second memory operation or the refresh operation.

BRIEF DESCRIPTION OF THE DRAWINGS

FIG. 36 illustrates the configuration of a form of packaging of a DRAM chip requiring no refreshing from outside to realize an embodiment of the present invention.

FIG. 37 is a timing chart for describing an example of the prior art.

DETAILED DESCRIPTION OF THE PREFERRED EMBODIMENTS

Figure 1:
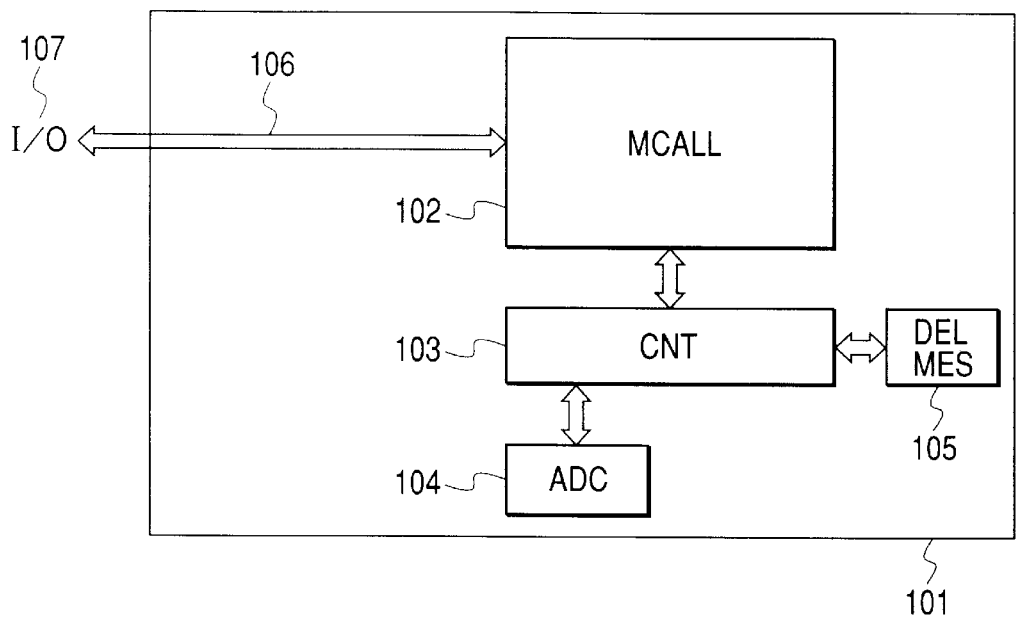
FIG. 1 is a block diagram illustrating a first preferred embodiment of the basic concept of the present invention.

FIG. 1 is a block diagram illustrating a first preferred embodiment of the basic concept of the present invention. With in a memory LSI chip 101, there are provided an overall circuit (MCALL) 102 for guaranteeing usual DRAM operations, a control circuit (CNT) 103 for performing overall control including operating mode switching, an address counter (ADC) 104 and a delay time measuring circuit (DELMES) 105.

In the semiconductor memory device shown in FIG. 1, switching between write/read operations and refresh operations is automatically accomplished by the control circuit (CNT) 103 and the delay time measuring circuit (DELMES) 105 in the following manner. First, upon entry of an external input signal (I/O) 107 from an input/output signal line 106, a refresh operation is immediately carried out. When the refreshing of a memory cell on a word line designated by an address counter (ADC) 104 is completed, the word line is closed, and bit lines are precharged. Immediately after that, a word line designated by a write/read operation address is activated.

The write/read operation in the later half of the aforementioned cycle can be realized by estimating in advance the length of time from the entry of an external address and the bit lines are precharged, appropriately regulating the time at which the delay time measuring circuit (DELMES) 105 takes in the external address, and the activation of the word line matching the address from overlapping the precharging of the bit lines in the refreshing operation.

This delay time measuring circuit (DELMES) 105は, control circuit (CNT) 103 is a circuit intended to delay signals supplied by the control circuit (CNT) 103 by a required length of time (t1+t2−t4), where t1 is the delay time from the address counter output till the word line driver input; t2, that from the word line driver input till the bit line precharging; and t4, from the address input till the word line driver input.

In the following discussion regarding other embodiments of the invention, (1) 501, 601, 801, 1001, and 1101 denote Memory LSI chips that operate similar to 101; (2) 502, 602, 802, 1002, and 1102 denote overall circuits for guaranteeing normal DRAM operations (MCALL) and that operate similar to 102; (3) 503, 603, 803, 1003, 1103 denote control circuits for performing overall control including refreshing/ reading, writing operating mode switching (CNT) that operate similar to 103; (4) 504, 604, 804, 1004, 1104, 3010, 3410, 3110, 3210, 3610, 3710 denote address counters (ADC) that operate similar to 104; (5) 505, 805, 1005, 1105 denote delay time measuring circuit (DELMES) that operate similar to 105; (6) 506, 606, 806, 1006, 1106 denote input/ output signal lines that operate similar to 106; and (7) 307, 507, 607, 807, 1007, 1107 denote external input/output signals (110) that operate similar to 107.

Figure 2:
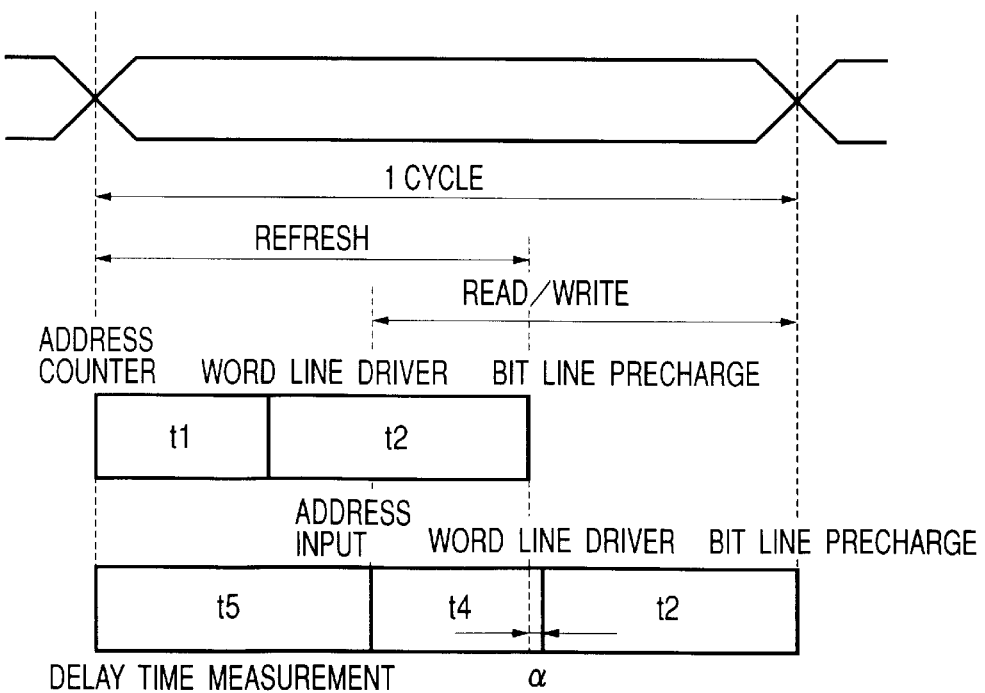
FIG. 2 is a timing chart for describing the operation of the embodiment shown in FIG. 1.

FIG. 2 is a timing chart. Compared with the timing chart of the embodiment of the prior art shown in FIG. 37, it is seen that the invention enables the blank time between the word line activation period in the former half of the cycle and the word line activation period in the latter half can be set to the minimum, so that the cycle time can be reduced by (t3+t4−α), where t3 is the time length of bit line precharge detection and α, a timing margin for preventing process, voltage and temperature variations from letting the precharge of overlap the rise of the next word line.

While the foregoing description referred to a case in which the refresh operation was carried out in the former half and the write/read operation, in the latter half of the cycle, a reversed sequence can be accomplished similarly. The aforementioned blank time can be minimized and the cycle time shortened also by causing the delay time measuring circuit (DELMES) 105 to appropriately shift the activation timing of the word line driver, address decoding or address pre-decoding instead of the timing of address input.

The foregoing description supposed two operations in a cycle, but this is nothing to limit the number of operations per cycle. Further, the description applies not only to a refresh operation and a write/read operation, but also to other combinations including one of a write operation and a read operation. Thus, the invention is intended to minimize the blank time between the word line activation period in the former half of the cycle and the word line activation period in the latter half, and this holds true whether more than two operations are performed in a cycle or only one operation is done in a cycle. The operations in this context refer to the refresh operation, write operation, read operations and total operations. The choice of two operations per cycle, in particular a refresh operation and a write/read operation, is merely to facilitate comparison with the prior art. Whereas the same applies to the subsequent description, this supplementary explanation will be dispensed with to avoid redundancy.

Figure 3:
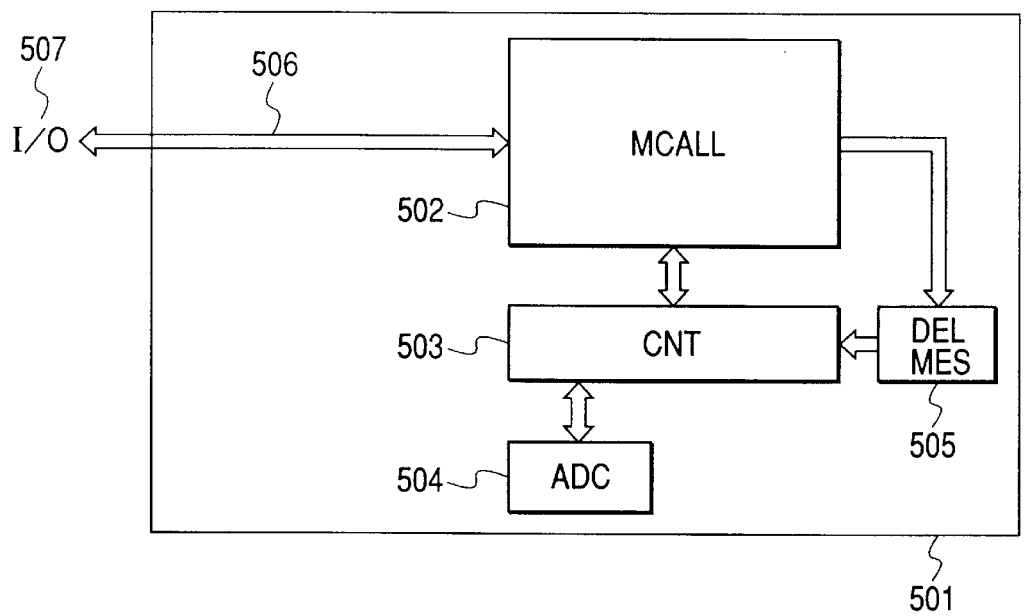
FIG. 3 is a block diagram illustrating a second preferred embodiment of the basic concept of the invention.

FIG. 3 is a block diagram illustrating a second preferred embodiment of the basic concept of the invention. This embodiment differs from the first illustrated in FIG. 1 in the configuration of a delay time measuring circuit (DELMES) 505. The delay time measuring circuit (DELMES) 505 of FIG. 3 receives a signal from an overall circuit (MCALL) 502, and measures the delay time. For instance, receiving an actuation signal for a sense amplifier, the delay time measuring circuit (DELMES) 505 delays the length from the actuation of the sense amplifier until the precharging of bit lines, and takes in an external address at an appropriate timing. As the same delay time as an actual circuit is obtained until the actuation of the sense amplifier, delay time errors in process, voltage and temperature variations are less than with the delay time measuring circuit (DELMES) 105 of FIG. 1. As the length of time to be delayed is shorter, there is an additional advantage of allowing the layout area of the delay circuit to be reduced. As its operation is the as that described with reference to FIG. 1, its description and timing chart are dispensed with.

Figure 4:
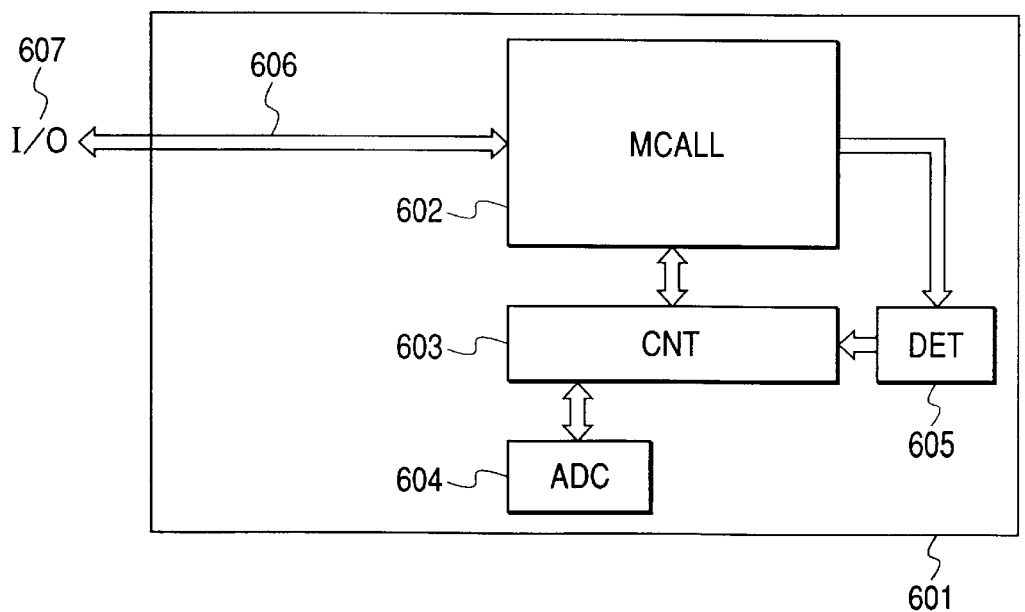
FIG. 4 is a block diagram illustrating a third preferred embodiment of the basic concept of the invention.

FIG. 4 is a block diagram illustrating a third preferred embodiment of the basic concept of the invention. This embodiment differs from the first illustrated in FIG. 1 in the addition of a detection circuit (DET) 605 in place of the delay time measuring circuit. The detection circuit (DET) 605 detects the stand-by state of every node in an overall circuit (MCALL) 602.

Figure 5:
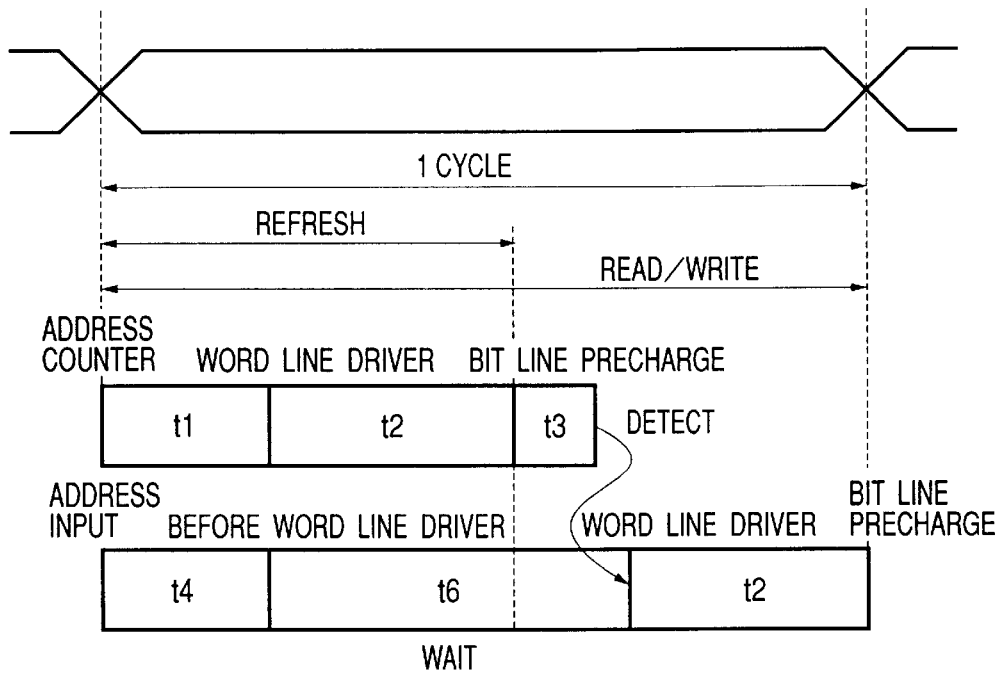
FIG. 5 is a timing chart for describing the operation of the embodiment shown in FIG. 4.

FIG. 5 is a timing chart of detection of the precharging of bit lines as an example of detection. According to the invention, precharging of bit lines is detected to actuate a word line driver. As a result, comparison of the timing chart of FIG. 37 according to the prior art and the timing chart of FIG. 5 according to the present invention reveals that the cycle time from the address input till the word line driver input is reduced by an equivalent of the delay time t4. Similarly, it is also possible to actuate the address decoder, address pre-decoder and the like by detecting the precharging of bit lines. In this case, the cycle time can be reduced by an equivalent of the delay time from the address input till the address decoder, that from the address input till the address predecoder or the like.

Figure 6:
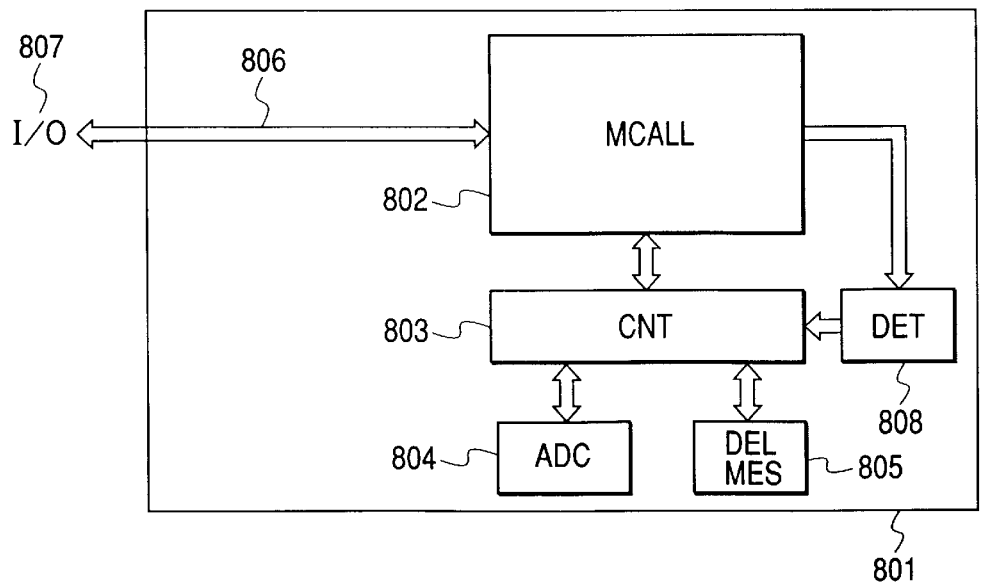
FIG. 6 is a block diagram illustrating a fourth preferred embodiment of the basic concept of the invention.

FIG. 6 is a block diagram illustrating a fourth preferred embodiment of the basic concept of the invention. A detection circuit (DET) 808 is added to the embodiment of FIG. 1. While in the embodiment of FIG. 1 a word line designated by the address of a write/read operation is activated after a refresh operation is completed, word lines are closed and bit lines are precharged, in this embodiment of FIG. 6 a word line designated by the address of a write/read operation is activated even later, after the precharging of bit lines is detected. This makes it unnecessary to allow for any error in process, voltage and temperature variations attributable to the delay time measuring circuit (DELMES) 805, and according a time margin can be dispensed with, though there is needed an extra length of time for bit line precharge detection.

Figure 7:
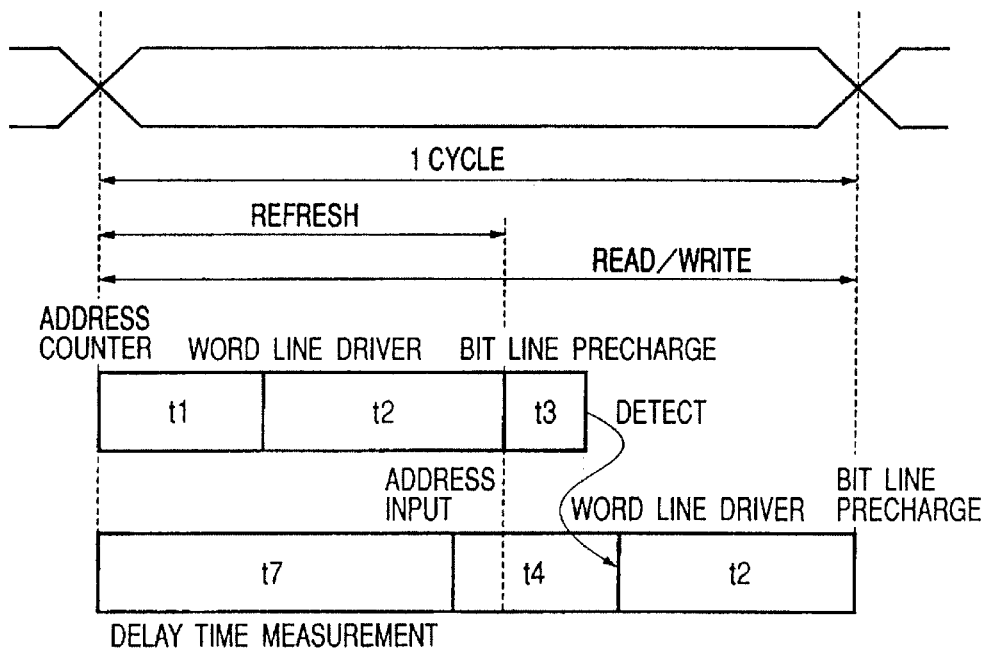
FIG. 7 is a timing chart for describing the operation of the embodiment shown in FIG. 6.

The cycle time, as shown in the timing chart of FIG. 7, is (t1+t2+t3+t2). Where α (margin) >t3 (detection time), the cycle time can be (α−t3) shorter than in the case of FIG. 1. Further, the delay time measuring circuit (DELMES) 805 may as well have the configuration shown in FIG. 3 with no problem at all.

In each of the embodiments of the invention so far described, a dynamic memory cell has to undergo a refresh operation at fixed intervals matching the length of time it holds information. In a memory device in which write/read operations are constantly taking place in regular cycles as described above, autonomous refreshing for each of such operations can achieve information maintenance. Write/read operations in memory cells connected to pertinent word lines are accompanied by refresh operations, since address designation is unfixed in such write/read operations, all the memory cells are refreshed by causing address counters (ADC) 104, 504, 604 and 804 to update the refresh address.

By inserting such autonomous refresh operations in the cycle of write/read operations, it is made possible to access memories in a DRAM in the same way as in a SRAM without having to give any particular instruction for a refresh operation from outside or obliging any write/read operation to wait for a refresh operation accomplished by an internal circuit.

Figure 8:
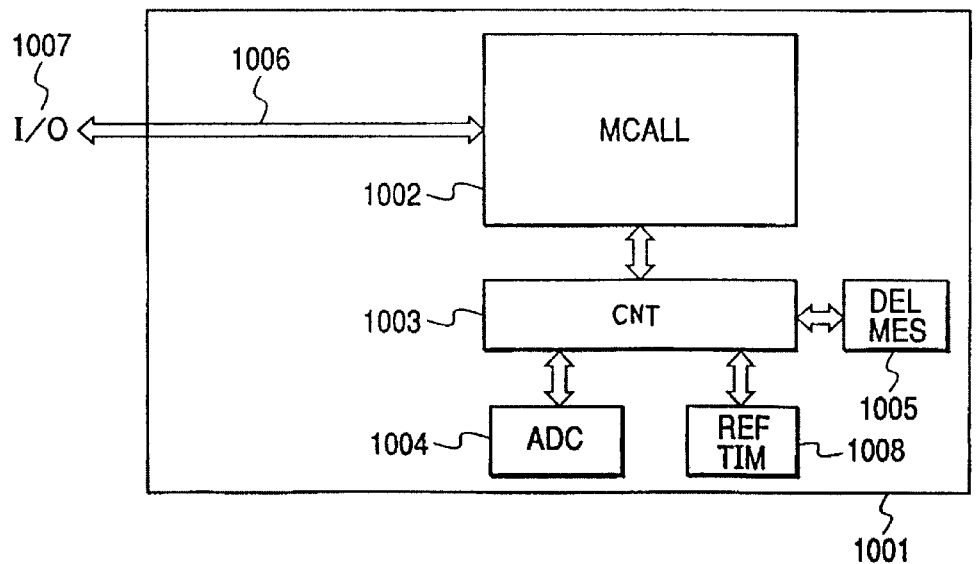
FIG. 8 is a block diagram illustrating a variation of a first preferred embodiment of the basic concept of the invention.

FIG. 8 is a block diagram illustrating a variation of the first preferred embodiment of the basic concept of the invention. In this embodiment, a timer (REFTIM) 1008 is added to the configuration of FIG. 1. A DRAM need not be refreshed en every cycle. Thus, it is sufficient to refresh it within the duration of information holding by the memory cells. For instance, a typical 64 Mbit DRAM, which is refreshed at every 64 ms and has 4,096 refresh cycles, one refresh operation in every 15,625 µs (64 ms/4,000) would be sufficient.

Thus, as designated by the address counter, a memory cell connected on the 0-th word line is refreshed, followed by the refreshing of cells on the first word line, second word line and so forth. In order that the length of time until the 0-th word line is refreshed next be 64 ms, cells on the word lines can be refreshed at 15,625 μs intervals. Incidentally, as is well known, refreshing of a DRAM means refreshing of all the memory cells connected to word lines through the activation of the word line, and accordingly the activation of all the word lines results in refreshing of all the memory cells.

The timer (REFTIM) 1008 is intended to supply a refresh request pulse at regular intervals (15,625 μs). In the embodiment shown in FIG. 8, if the memory LSI is continuously in a read/write operation state, a refresh operation is performed once in the former or latter half of a fixed cycle in which the refresh request pulse and a read/write operation compete with each other, and the read/write operation is accomplished in the latter or former half of the cycle. Or if a stand-by state continues for a long period, refresh operations alone can be performed at regular intervals in response to a refresh request pulse. As this keeps read/write operations from an external terminal from being limited by a refresh operation, the DRAM can be handled in the same way as a SRAM.

The configuration shown in FIG. 8, as it limits the frequency of refresh operations, is effective for saving power consumption. Thus, when a read/write operation and a refresh operation compete with each other, the refresh operation is performed to match the situation and the refresh address is updated, the frequency at which a refresh operation alone is performed can be reduced. Furthermore, even when memory remain unaccessed from outside for a long period of time, automatic refreshing takes place within, and accordingly the stored information does not disappear, so that the DRAM can be handled in the same way as a SRAM as stated above.

Any of the second, third and fourth embodiments of the basic concept of the invention illustrated in the foregoing block diagrams (FIG. 3, FIG. 4 and FIG. 6) may be augmented with the aforementioned timer. No embodiment augmented with such a timer is neither illustrated nor described, because it is the same as what is shown in FIG. 8.

Figure 9:
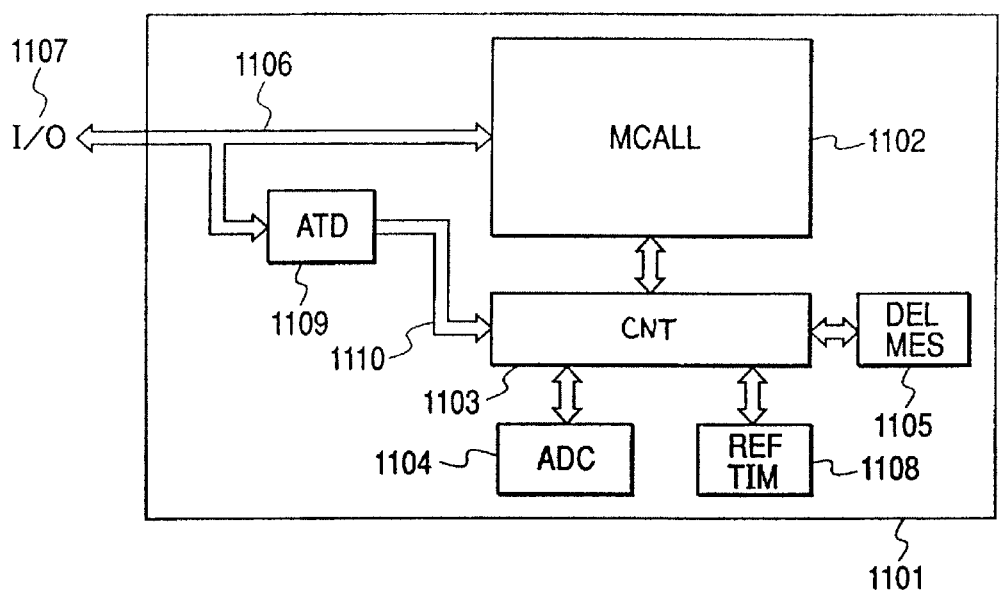
FIG. 9 is a block diagram illustrating another variation of a first preferred embodiment of the basic concept of the invention.

FIG. 9 is a block diagram illustrating another variation of the embodiment, in which the invention is applied to a memory LSI which starts operating when an address is entered. In this embodiment, an address input variation detection circuit (ATD) 1109 is added to the configuration of FIG. 8. This detection circuit ATD 1109 detects any variation in address input and supplies a signal 1110 as shown in FIG. 9. The configuration is the same as the embodiment shown in FIG. 8 in all other aspects of operation.

Any of the second, third and fourth embodiments of the basic concept of the invention illustrated in the foregoing block diagrams (FIG. 3, FIG. 4 and FIG. 6) may be augmented with the aforementioned timer and detection circuit ATD. No embodiment augmented with such a timer and detection circuit ATD is neither illustrated nor described, because it is the same as what is shown in FIG. 9.

In the following discussion regarding other embodiments of the invention, (1) 3009, 3109, 3209, 3409, 3509, 3609, 3709 denote refresh timers (REFTIM) that operate similar to 1008, 1108; and (2) 3005, 3105, 3205, 3405, 3505, 3605, 3705 denote address input variation detection circuits (ATD) that operate similar to 1109.

Figure 10:
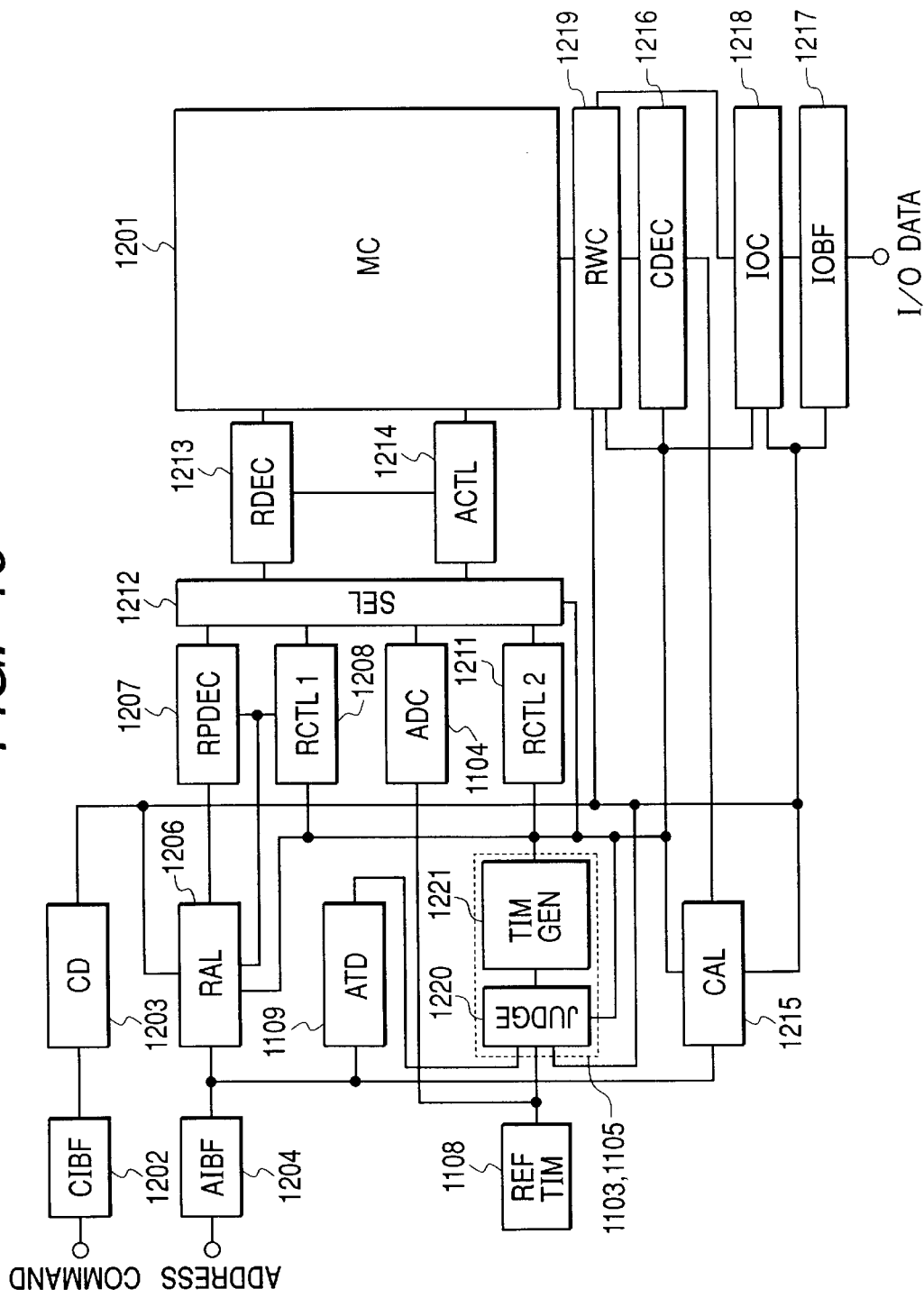
FIG. 10 is a block diagram illustrating a specific example of the embodiment shown in FIG. 9.

FIG. 10 is a block diagram illustrating a specific example of the embodiment shown in FIG. 9. A memory cell array (MC) 1201 comprises a plurality of word lines, a plurality of bit lines and dynamic memory cells, sense amplifiers, sub-word drivers and the like provided at the intersections of the lines. An input buffer (CIBF) receives commands from outside. A command decoder (CD) 1203 decodes the entered commands. An input buffer (AIBF) 1204 receives addresses from outside. An address variation detection circuit (ATD) 1109 detects any variation in the entered address signals. A row address latch circuit (RAL) 1206 latches row addresses entered via the input buffer 1204.

A row pre-decoder (RPDEC) 1207 pre-decodes the latched row address. A 3, row controller 1 (RCTN1) 1208 generates control signals for the sense amplifier and the like matching the write/read operation. A refresh timer (REFTIM) 1108 supplies refresh request pulses matched to the information holding time lengths of memory cells at regular intervals. An address counter (ADC) 1104 counts the refresh request pulses and generates a refresh address. A row controller 2 (RCTL2) 1211 generates control signals for the sense amplifier and the like matching the refresh operation. A selector (SEL) 1212 switches according to whether the operation is for refresh or write/read. A row decoder (RDEC) 1213 decodes row addresses. An array control (ACNT) 1214 controls the operations of the sense amplifier and the like.

A column address latch (CAL) 1215 latches column addresses entered via the input buffer 1204. A column decoder (CDEC) 1216 decodes the column addresses. An input/output buffer (IOBF) 1217 externally supplies data read out of the memory cell array (MC) 1201, and receives data from outside.

An input/output circuit (IOC) 1218 temporarily stores data read out of the memory cell array (MC) 1201, conveys them to the input/output buffer (IOBF) 1217, and temporarily stores external data from the input/output buffer (IOBF) 1217. A read/write circuit (RWC) 1219 conveys data read out of the memory cell array (MC) 1201 to the input/output circuit (IOC) 1218, and writes write data from the input/output circuit (IOC) 1218 into the memory cell array (MC) 1201.

A judging circuit (JUDGE) 1220 determines the sequence of arrival among the output of the command decoder (CD) 1203, that of the ATD 1109 and the timer (REFTIM) 1108. A timing generation circuit (TIMGEN) 1221 receives the output of the judging circuit (JUDGE) 1220, and generates timings matching refresh and write/read operations.

The judging circuit (JUDGE) 1220 and the timing generation circuit (TIMGEN) 1221 in FIG. 10 correspond to the control circuit (CNT) 1103 in FIG. 9, and the delay time measuring circuit (DELMES) 1105 is contained the timing generation circuit (TIMGEN) 1221.

In the following discussion regarding other embodiments of the invention, (1) 3001, 3101, 3201, 3401, 3501, 3601, 3701 denote memory cell arrays (MC) that operate similar to 1201, (2) 3002, 3102, 3202, 3402, 3502, 3602, 3702 denote command input buffers (CIBF) that operate similar to 1201, (3) 3003, 3103, 3203, 3403, 3503, 3603, 3703 denote command decoders (CD) that operate similar to 1203, (4) 3004, 3104, 3204, 3404, 3504, 3604, 3704 denote address input buffers that operate similar to 1204 (AIBF), (5) 3006, 3106, 3206, 3404, 3506, 3606, 3706 denote row address latch circuits (RAL) that operate similar to 1206, (6) 3007, 3107, 3113, 3207, 3407, 3507, 3607, 3707 denote row pre-decoders (RPDEC) that operate similar to 1207; (7) 3008, 3408, 3508 denote row controllers 1 (RCTL 1) that operate similar to 1208; (8) 3011, 3411, 3511 denote row controllers 2 (RCTL 2) that operate similar to 1211; (9) 3012, 3112, 3412, 3512, 3612, 3712, 3304 denote selector (SEL) that operate similar to 1212, (10) 3023, 3113, 3213,

3423, 3513, 3613, 3713 denote row decoders (RDEC) that operate similar to 1213, (11) 3114, 3214, 3514, 3614, 3714, 3024, 3424 denote array controls (ACTL or ACTL1) that operate similar to 1214; (12) 3015, 3115, 3215, 3415, 3515, 3615, 3715 denote column, address latches (CAL) that operate similar to 1215; (13) 3016, 3116, 3216, 3416, 3516, 3616, 3716 denote column address decoders (CDEC) that operate similar to 1216; (14) 3017, 3117, 3217, 3417, 3517, 3617, 3717 denote input/output buffers (IOBF) that operate similar to 1217, (15) 3018, 3118, 3218, 3418, 3518, 3618, 3718 denote input/output circuits (IOC) that operate similar to 1218, (16) 3019, 3119, 3219, 3419, 3519, 3619, 3719 denote read/write circuits (RWC) that operate similar to 1219; (17) 3020, 3120, 3220, 3420, 3520, 3620, 3720 denote judging circuits (JUDGE) that operate similar to 1220; (18) 3021, 3121, 3221, 3421, 3521, 3621, 3721 denote timing generation circuits (TIMGEN) that operate similar to 1221; and (19) 3110, 3210, 3510, 3610, 3710 denote address counters (ADC) that operate similar to 1104.

Figure 11:
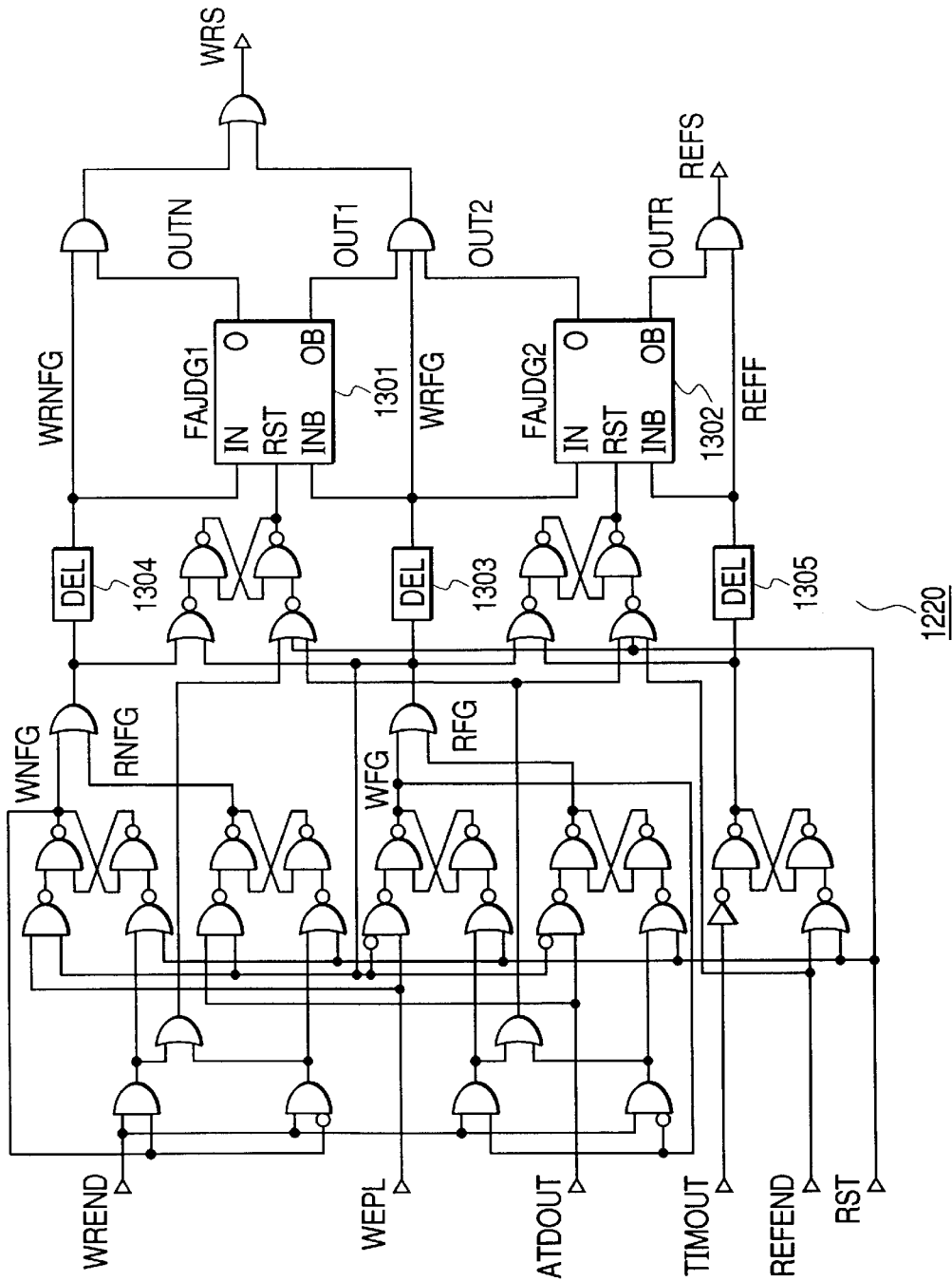
FIG. 11 is a circuit diagram illustrating an example of the judging circuit in the configuration shown in FIG. 10.

FIG. 11 is a circuit diagram illustrating the judging circuit (JUDGE) 1220 in the configuration shown in FIG. 10. Whereas its operations will be described in detail later on, a brief description will be given here. In response to the earliest to arrive among a write request pulse WEPL, a read request pulse (address signal variation detection signal) ATDOUT and a refresh request pulse (timer output) TMOUT, a write/read state signal WRS or a refresh state signal REFS, respectively, is supplied.

Receiving the output, the timing generation circuit (TIMGEN) 1221 shown in FIG. 10 generate timings matching the respective operations. For requests having arrived second or later, operations are executed in the order of arrival after the first requested operation is completed. If the next write request pulse WEPL or read request pulse ATDOUT arrives during a write/read operation, similarly the next write/read operation is executed after the completion of the first requested operation is completed.

In this embodiment of the invention, the judging circuit is designed on the basis of the supposition that write request pulse WEPL comes always earlier than the read request pulse ATDOUT and that there will be no refresh request if a write/read operation and the next write/read operation overlap each other. This supposition derives from the assumption that a write/read operation and the next write/read operation overlap each other only immediately after the execution of a refresh operation. Even if this assumption does not hold, a judging circuit matching the given condition can be used.

Figure 12:
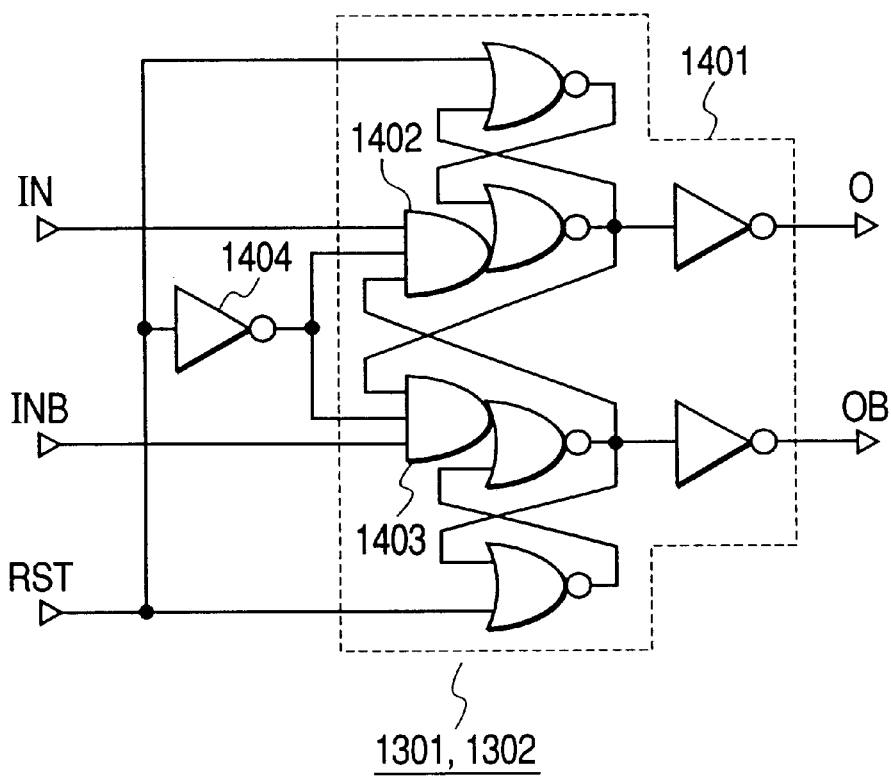
FIG. 12 is a circuit diagram illustrating an example of the first arrival judging circuits in the configuration shown in FIG. 11.

FIG. 12 is a circuit diagram illustrating an example of the first arrival judging circuits (FAJDG1 and 2) 1301 and 1302 in the configuration shown in FIG. 11. The basic configuration of each of these circuits comprises the first arrival signal selecting circuit 1401 and the inverter 1404 described in JP-A-7-245558. However, the two AND gate configuration of the first arrival signal selecting circuit 1401 (the AND gates 1402 are 1403) according to JP-A-7-245558 is replaced by a three AND gate configuration in the circuit under the present application, and the output of the inverter 1404 (inverted signal of RST) is additionally entered.

The operation of this circuit will now be described. When the signal RST is raised to a high level (hereinafter to be abbreviated to H), output signals O and OB drop to a low level (hereinafter to be abbreviated to L) to set an initial state. After that, if either one of input signals IN and INB reaches H earlier than the other after the signal RST is lowered to L, an output signal O or O13 will rise to H. If, for instance, the input signal IN rises to H earlier, the output signal O will rise to H, with the output signal OB remaining at L. Although these outputs will be held even if the input signals IN and INB turn into another state (H and H, L and H or L and L), but if the signal RST rises to H, the output signals O and O13 will return to their initial level L.

Figure 13:
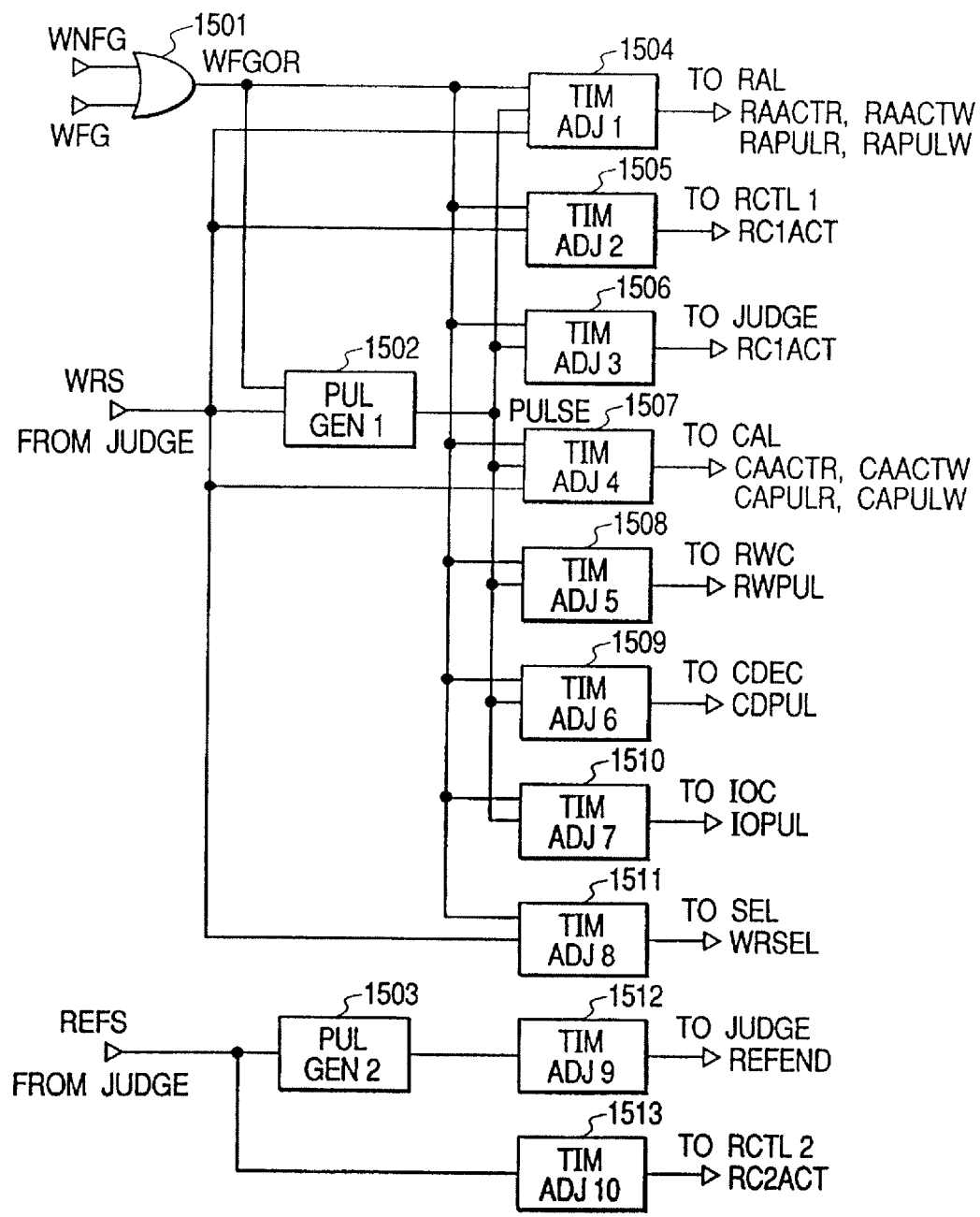
FIG. 13 is a block diagram illustrating an example of the timing generation circuit in the configuration shown in FIG. 10.

FIG. 13 is a block diagram illustrating an example of the timing generation circuit (TIMGEN) 1221 in the configuration shown in FIG. 10. When a signal WRS supplied from the judging circuit (JUDGE) 1220 is entered, the signal WRS is entered into timing regulation circuits 2 and 8 (TIMADJ2 and 8) 1505 and 1511 to undergo timing regulation, and are supplied to the row address controller 1 (RCTL1) 1208 and the selector (SEL) 1212 (RCACT and WRSEL).

The signal WRS is entered into a basic pulse generating circuit 1 (PULGEN1) 1502, and turned into a pulse. This output signal PULSE is entered into a timing regulation circuit 3 (TJMADJ3) 1506, a timing regulation circuit 5 (TIMADJ5) 1508, a timing regulation circuit 6 (TIMADJ6) 1509 and a timing regulation circuit 7 (TIMADJ7) 1510, in which they are regulated in timing and pulse width, and the regulated signals (RC1ACT, RWPUL, CDPUL and IOPUL) are supplied to the judging circuit (JUDGE) 1220, the read/write circuit (RWC) 1219, the column decoder (CDEC) 1216 and the input/output circuit (10C) 1218.

The signals WRS and PULSE enter into a timing regulation circuit 1 (TIMADJ1) 1504 and a timing regulation circuit 4 (TTMADJ4) 1507 to respectively undergo timing regulation and timing pulse width regulation. The regulated signals (RAACTR, RAACTW, RAPULR, RAPULW, CAACTR, CAACTW, CAPULR and CAPULW) are supplied to the row address latch (RAL) 1206 and the column address latch (CAL) 1215.

A signal WFGOR, i.e., the OR (logical sum) of the signals WNFG and WFG via an OR gate 1501, is entered into all of the basic pulse generating circuit 1 (PULGEN1) 1502 and the timing regulation circuits 1 through 8 (TIMADJ1 through 8) 1504 through 1511. This enables the regulated values of timing and pulse width to be altered according to the value of the signal WFGOR. In other words, the timing and pulse width are varied between read operations and write operations.

On the other hand, when the signal REFS supplied from the judging circuit (JUDGE) 1220 is entered, it is entered into a timing regulation circuit 10 (TIMADJ) 1513 to undergo timing regulation, and the regulated signal is supplied to the row address controller 2 (RCTL2) 1211 (RC2ACT). Also, the signal REFS is entered into a basic pulse generating circuit 2 (PULGEN2) 1503 and turned into a pulse. This output signal is entered into a timing regulation circuit (TIMADJ9) 1512, undergoes the regulation of timing and pulse width, and supplied to the judging circuit (JUDGE) 1220 (REFEND).

Figure 14:
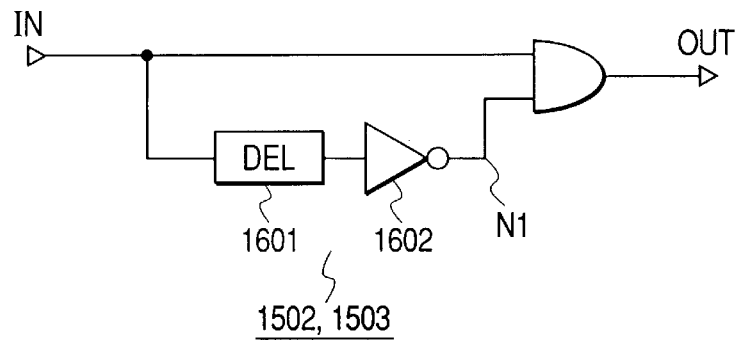
FIG. 14 is a circuit diagram illustrating an example of the basic pulse generation circuits in the configuration shown in FIG. 13.

FIG. 14 is a circuit diagram illustrating an example of the basic pulse generation circuits 1 and 2 (PULGEN1 and 2) 1502 and 1503 in the configuration shown in FIG. 13. This example is a circuit to obtain the pulse width (t+Δ) (where Δ is the delay time of an inverter 1602) by computing the AND (logical product) of a delayed signal N1, resulting from inversion by the inverter 1602 after the delaying of the input signal In by a length of time t by a delay circuit (DEL) 1601, and the input signal IN.

Figure 15:
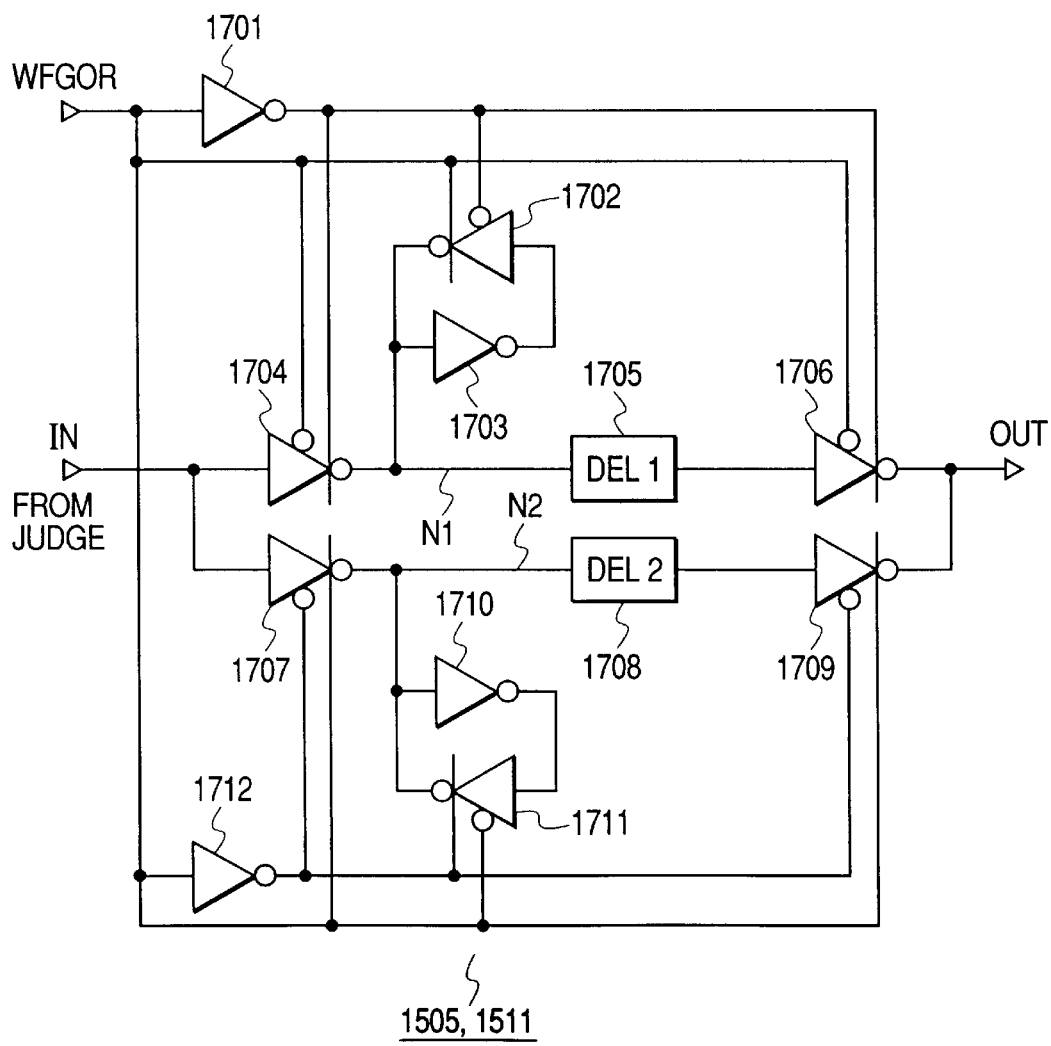
FIG. 15 is a circuit diagram illustrating an example of the timing regulation circuits 2, 8 and 10 in FIG. 13.

FIG. 15 is a circuit diagram illustrating an example of the timing regulation circuits 2, 8 and 10 (TIMADJ2, 8 and 10) 1505, 1511 and 1513 in FIG. 13. When the signal WFGOR is at L, the outputs of the inverter's 1701 and 1702 take on the H level, clocked inverters 1704, 1706, and 1711 are enabled, and clocked inverters 1702, 1707, and 1709 are disabled. As a result, the input IN signal is conveyed to an output OUT via a node N1 and a delay circuit 1 (DEL1) 1705, and a node N2 is latched by the clocked inverter 1711 and the inverter 1710.

When the signal WFGOR is at H, the outputs of the inverter 1701 and the inverter 1712 take on the L level, the clocked inverters 1704, 1706 and 1711 are disabled, and the clocked inverters 1702, 1707 and 1709 are enabled. As a result, the input signal IN is conveyed to the output OUT via the node N2 and the delay circuit 2 (DEL2) 1708, and the node N1 is latched by the clocked inverter 1702 and the inverter 1703.

Figure 16:
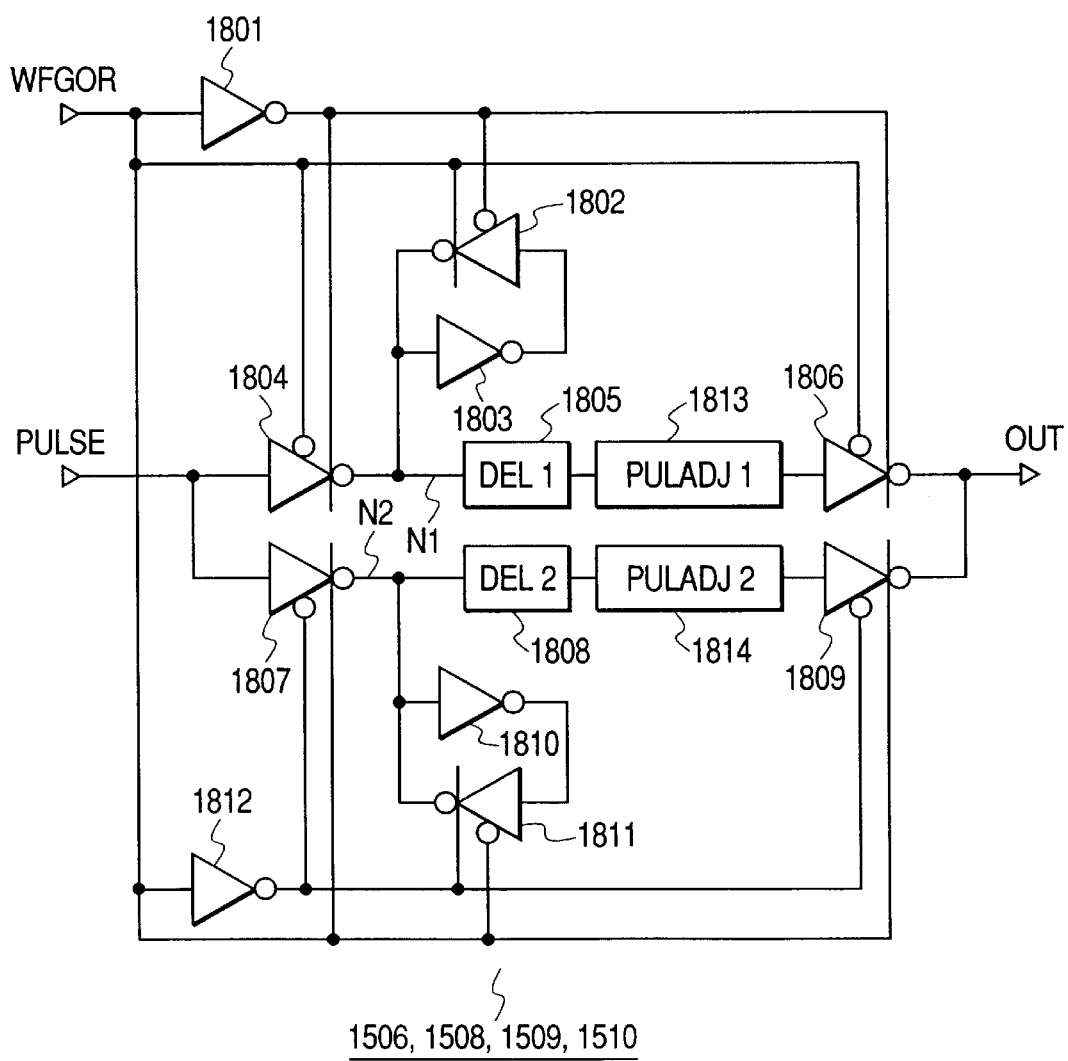
FIG. 16 is a circuit diagram illustrating an example of the timing regulation circuits 3, 5, 6, 7 and 9 in FIG. 13.

FIG. 16 is a circuit diagram illustrating an example of the timing regulation circuits 3, 5, 6, 7 and 9 (TIMGEN3, 5, 6, 7 and 9) 1506, 1508, 1509, 1510 and 1512 in FIG. 13. When the signal WFGOR is at L, the outputs of the inverters 1801 and 1812 take on the H level, the clocked inverters 1804, 1806, and 1811 are enabled, and the clocked inverters 1802, 1807 and 1809 are disabled. As a result, the input signal PULSE is conveyed to the output OUT via the node N1, the delay circuit 1 (DEL1) 1805 and a pulse width regulating circuit 1 (PULAD J1) 1813, and the node N2 is latched by the clocked inverter 1811 and the inverter 1810.

When the signal WFGOR is at H, the outputs of the inverters 1801 and 1812 take on the L level, the clocked inverters 1804, 1805 and 1811 are disabled, and the clocked inverters 1802, 1807 and 1809 are enabled. As a result, the input signal PULSE is conveyed to the output OUT via the node N2, the delay circuit 2 (DEL2) 1808 and a pulse width regulating circuit 2 (PULADJ2) 1814, and the node N1 is latched by the clocked inverter 1802 and the inverter 1803.

Figure 17:
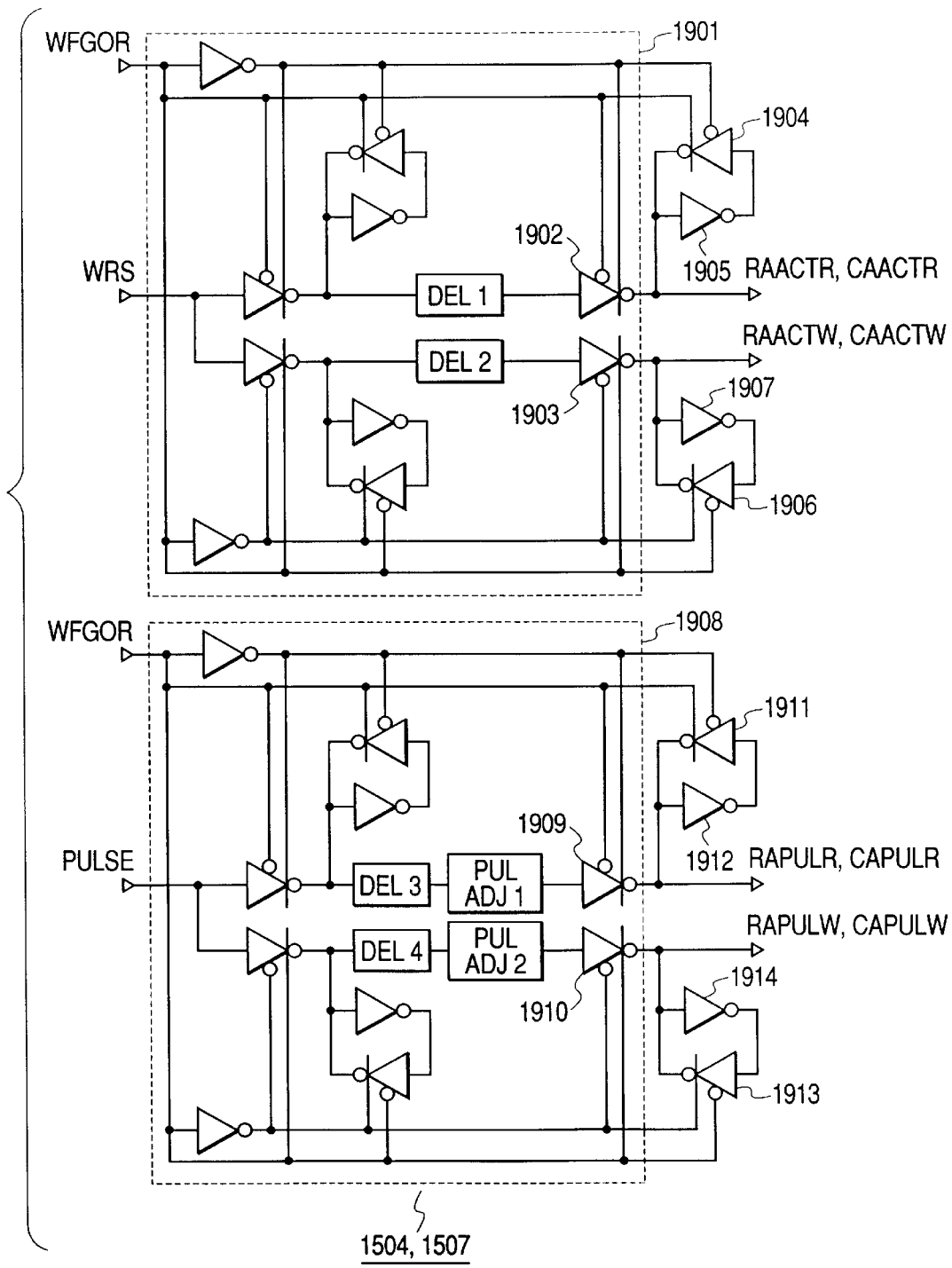
FIG. 17 is a circuit diagram illustrating an example of the timing regulation circuits 1 and 4 in FIG. 13.

FIG. 17 is a circuit diagram illustrating an example of the timing regulation circuits 1 and 4 (TIMADJ1 and 4) 1504 and 7507 in FIG. 13. It is a circuit in which an example 1901 of the timing regulation circuit shown in FIG. 15 and an example 1908 of the timing regulation circuit shown in FIG. 16, both partly modified, are arranged.

The partly modified example 1901 of the timing regulation circuit shown in FIG. 15 means a version of the circuit shown in FIG. 15 whose output is separated. It is so disposed that, when the clocked inverters 1902 and 1903 connected to the separate outputs are disabled, the respective output data are latched by the clocked inverter 1904 and the inverter 1905 on the one hand and by the clocked inverter 1906 and the inverter 1907 on the other.

The partly modified example 1908 of the timing regulation circuit shown in FIG. 16 means a version of the circuit shown in FIG. 16 whose output is separated. It is so disposed that, when the clocked inverter 1909 and 1910 are disabled, the respective output data are latched by the clocked inverter 1911 and the inverter 1912 on the one hand and by the clocked inverter 1913 and the inverter 1914 on the other.

Figure 18:
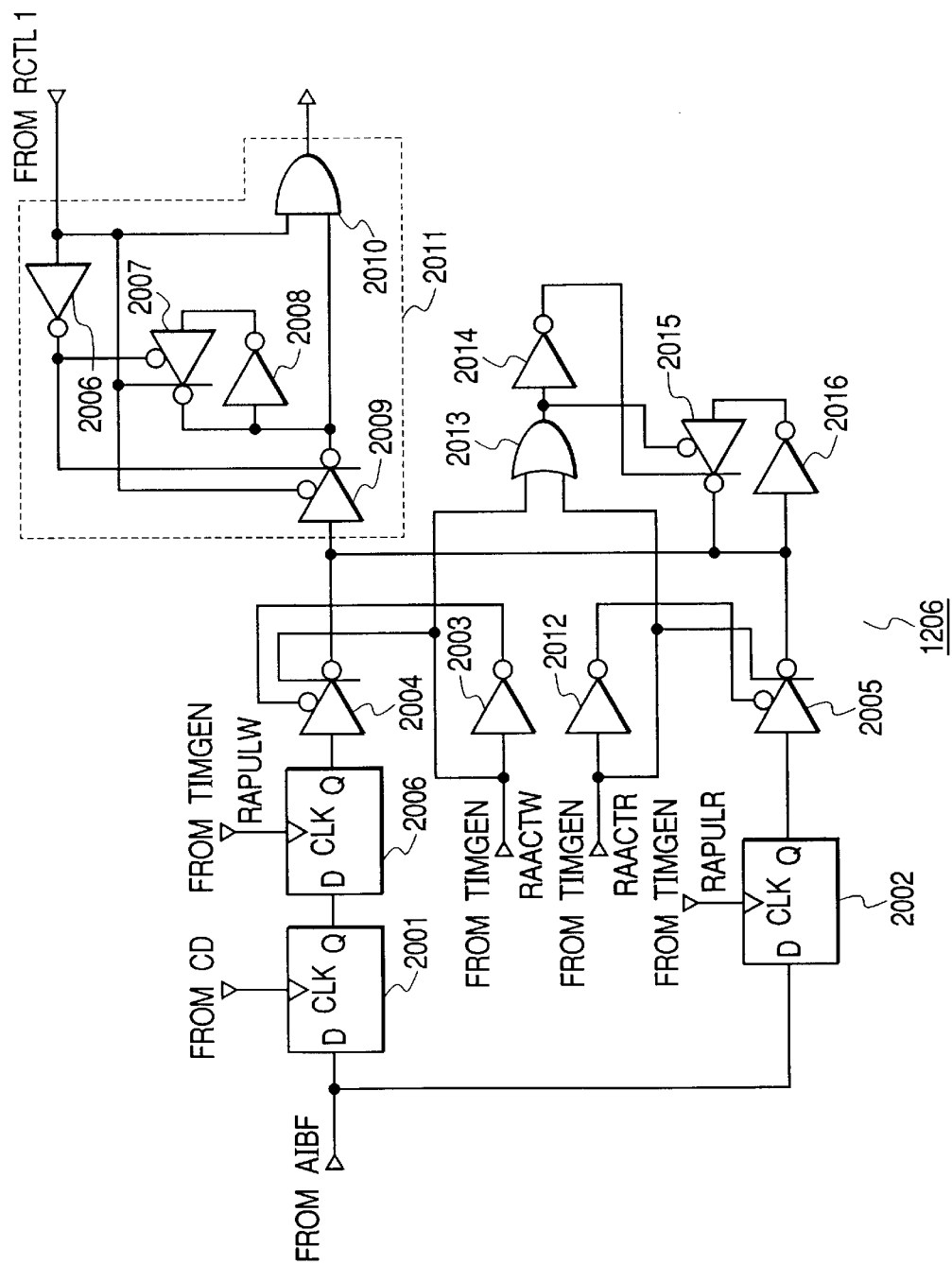
FIG. 18 is a circuit diagram illustrating an example of the row address latch shown in FIG. 10.

FIG. 18 is a circuit diagram illustrating an example of the row address latch (RAL) 1206 shown in FIG. 10. A register 2001 latches the input address with the output of a command decoder (CD) 1203 (a pulse for entering the write address) A register 2002 latches the input address with the output of the timing generation circuit (TIMGEN) 1221 (RAPULR). When a write operation is to be performed, the output of the register 2001 is latched by a register 2006 with RAPULW supplied from the timing generation circuit (TIMGEN) 1221.

Then, when RAACTW supplied from the timing generation circuit (TIMGEN) 1221 takes on the H level (write operation), the output of the inverter 2003 drops to L, and the clocked inverter 2004 is enabled. As RAACTR is at L then, the clocked inverter 2005 is disabled, resulting in the selection of the output of the register 2006.

When RAPULR supplied from the timing generation circuit (TIMGEN) 1221 is at H (read operation), the output signal of the inverter 2012 takes on the H level, and the clocked inverter 2005 is enabled. As RAACTW is at L then, the clocked inverter 2004 is disabled, resulting in the selection of the output of the register 2002. Then, as the output signal of the row address controller 1 (RCTL1) 1208 (address enable signal) is at L and the output signal of the inverter 2006 is H in a row address enable latch 2011, a clocked inverter 2009 is enabled, a clocked inverter 2007 is disabled, and the output signal of 2004 or 2005 referred to above is conveyed to the next stage via the clocked inverter 2009. However, as the output signal of the row address controller 1 (RCTL1) 1208 is at L, it is not conveyed beyond an AND gate 2010.

Next, when the output signal of the row controller 1 (RCTL1) 1208 takes on the H level, the output signal of the inverter 2006 drops to the L level in the row address enable latch 2011, the clocked inverter 2009 is disabled, the clocked inverter 2007 is enabled, and the output signal of 2004 or 2005 referred to above is latched by the clocked inverter 2007 and the inverter 2008.

Further, as the output signal of the row controller 1 (RCTNL1) 1208 is H, the output signal of 2004 or 2005 referred to above is conveyed to the next stage via an AND gate 2010. When both signals RAACTW and RAACTR are at L, the output signals of a NOR gate 2013 and an inverter 2014 take on the H and L levels, respectively, and the output signal of the clocked inverter 2004 or 2005 is latched by a clocked inverter 2015 and an inverter 2016.

Figure 19:
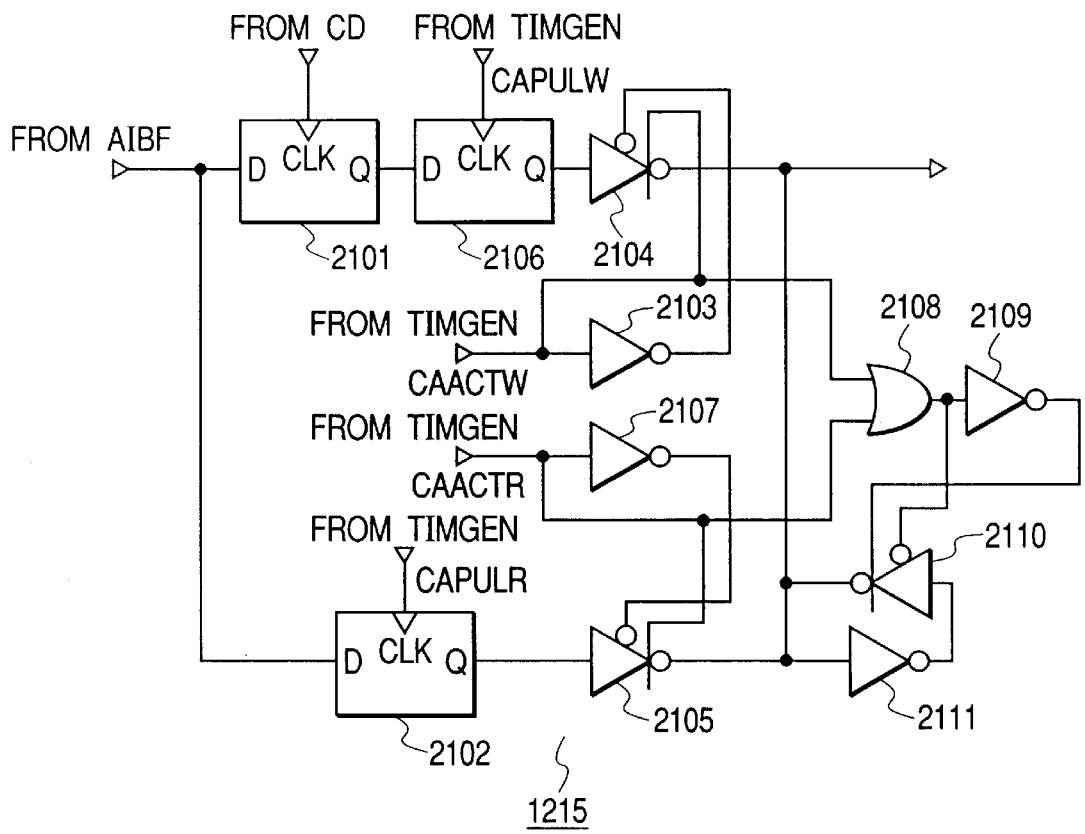
FIG. 19 is a circuit diagram illustrating an example of the column address latch shown in FIG. 10.

FIG. 19 is a circuit diagram illustrating an example of the column address latch (CAL) 1215 shown in FIG. 10. A register 2101 latches the input address with the output of a command decoder (CD) 1203 (pulse for write address input). A register 2102 latches the input address with the output of from the timing generation circuit (TIMGEN) 1221 (CAPULR).

When a write operation is to be performed, the output of the register 2101 is latched by a register 2106 with the signal CAPULW supplied from the timing generation circuit (TIMGEN) 1221. Next, when the signal CAACTW supplied from the timing generation circuit (TIIMGEN) 1221 takes on the H level (to perform a write operation), the output signal of the inverter 2101 drops to L, and a clocked inverter 2104 is enabled. As the signal CAACTR is at L then, a clocked inverter 2105 is disabled, resulting the selection of the output signal of the register 2106.

When the signal CAACTR supplied from the timing generation circuit (TIMGEN) 1221 is at H, the output of an inverter 2107 takes on the H level (to perform a write operation), and the clocked inverter 2105 is enabled. As the CAACTW is at L, the output of an inverter 2103 takes on the L level. Accordingly the clocked inverter 2104 is disabled, the output of the register 2102 is selected. When both signals CAACTW and CAACTR are at L, and the output signals of a NOR gate 2108 and an inverter 2109 take on the H and L levels, respectively, and the output signal of the clocked inverter 2104 or 2105 is latched by a clocked inverter 2110 and an inverter 2111.

Figure 20:
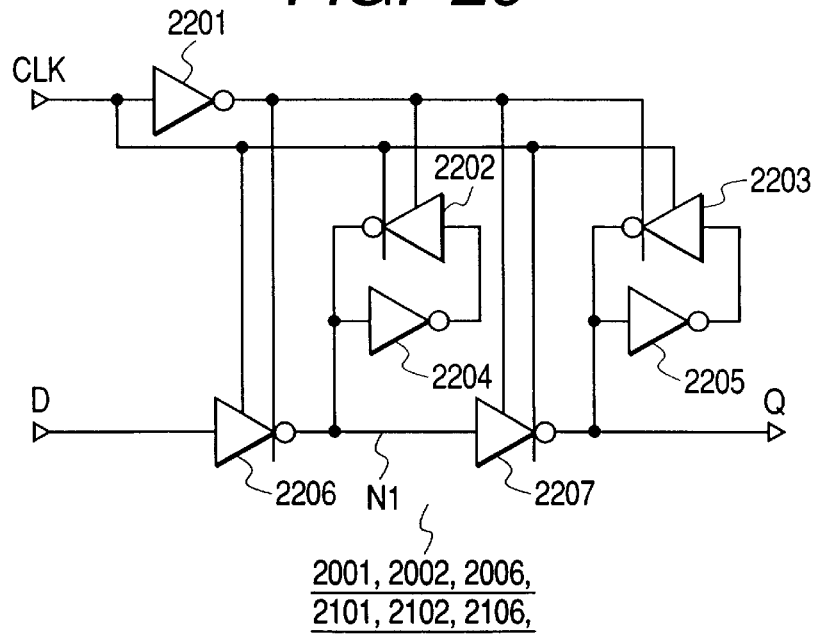
FIG. 20 is a circuit diagram illustrating an example of the registers in FIGS. 18 and 19.

FIG. 20 is a circuit diagram illustrating an example of the registers in FIGS. 18 and 19. When a clock signal CLK is at L, the output of the inverter 2201 is at H, clocked inverters 2206 and 2203 are enabled, clocked inverters 2202 and 2207 are disabled, and an input signal D is conveyed to the node N1 via the clocked inverter 2206. An output signal Q is latched by the clocked inverter 2203 and an inverter 2205. When the clock signal CLK takes on the H level, the output signal of the inverter 2201 drops to L, the clocked inverters 2206 and 2203 are disabled, the clocked inverters 2202 and 2207 are enabled, the input signal D is intercepted by the clocked inverter 2206, and data at the node N1 are conveyed as the output signal Q and latched by the clock converter 2202 and an inverter 2204.

Figure 21:
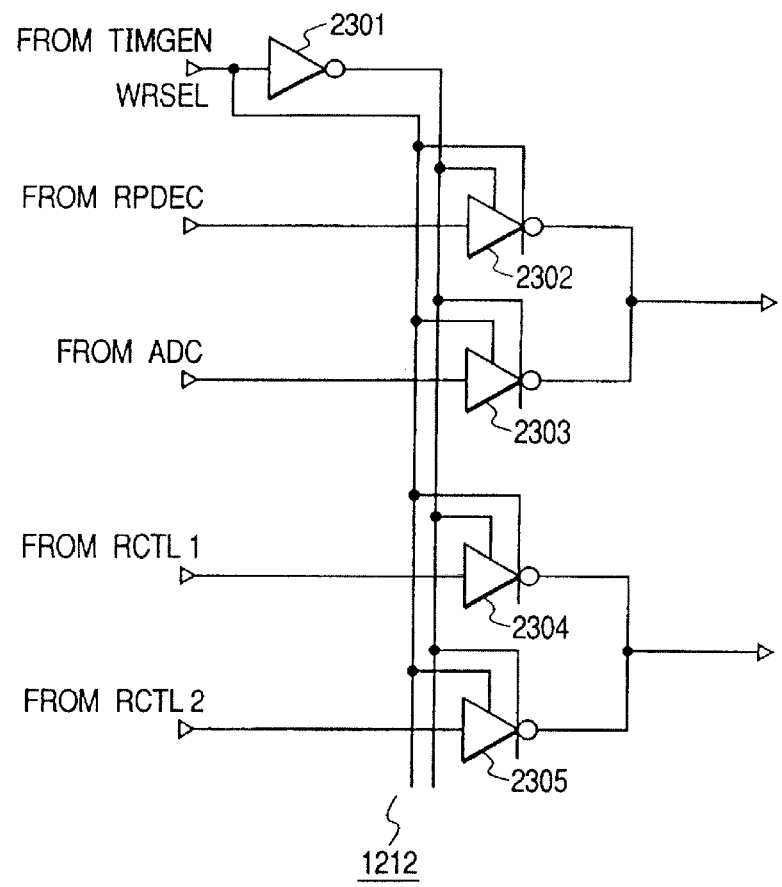
FIG. 21 is a circuit diagram illustrating an example of the selector shown in FIG. 10.

FIG. 21 is a circuit diagram illustrating an example of the selector (SEL) 1212 shown in FIG. 10. When the output signal of the timing generation circuit (TIMGEN) 1221 (a flag indicating a write/read operation) is at H (to perform a write/read operation), the output of an inverter 2301 takes on the L level, clocked inverters 2302 and 2304 are enabled, clocked inverters 2303 and 2305 are disabled, and the output signal of the row pre-decoder (RPDEC) 1207 and that of the row controller 1 (RCTL1) 1208 are selected.

When the output signal of the timing generation circuit (TIMGEN) 1221 (a flag indicating a write/read operation) is at (to perform a refresh operation), the output signal of the inverter 2301 rises to H, the clocked inverters 2302 and 2304 are disabled, the clocked inverters 2303 and 2305 are enabled, and the output signal of the address counter (ADC) 1104 and that of a row controller 2 (RCTL2) 1211 are selected.

Figure 22:
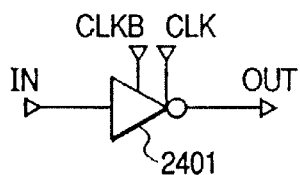
FIG. 22 is a symbol diagram of a clocked inverter used in this invention.

FIG. 22 is a symbol diagram of the clocked inverter. It is provided with an input signal terminal IN, an output signal terminal OUT and clock signal terminals CLK and CLKB.

Figure 23:
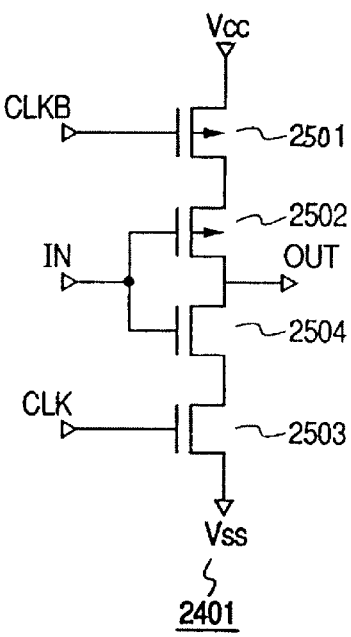
FIG. 23 is a circuit diagram illustrating an example of the clocked inverter of FIG. 22.

FIG. 23 is a circuit diagram illustrating a symbol 2401 of the clocked inverter of FIG. 2. It consists of a first PMOS 2501 of which the gate and source are respectively connected to a clock signal terminal CLKB and a power supply terminal Vcc; a second PMOS 2502 of which the gate, source and drain are respectively connected to the input signal terminal IN, to the drain of the first PMOS 2501 and to the output signal terminal OUT; a third NMOS 2503 of which the gate and source are respectively connected to the clock signal terminal CLK and to the grounding terminal Vss of the circuit; and a fourth NMOS 2504 of which the gate, source and drain are respectively connected to the input signal terminal IN, to the drain of the third NMOS 2503, and to the output signal terminal OUT and the drain of the second PMOS 2502.

The delay circuits (DEL, DELL and DEL2) shown in the foregoing FIGS. 11, 14, 15, 16 and 17 are configured of, for instance, inverter chains of the like.

Block diagrams of the pulse width regulating circuits (PULADJ1 and 2) shown in FIGS. 16 and 17 are dispensed with, because their configuration is the same as that of the basic pulse basic circuit shown in FIG. 14.

Figure 24:
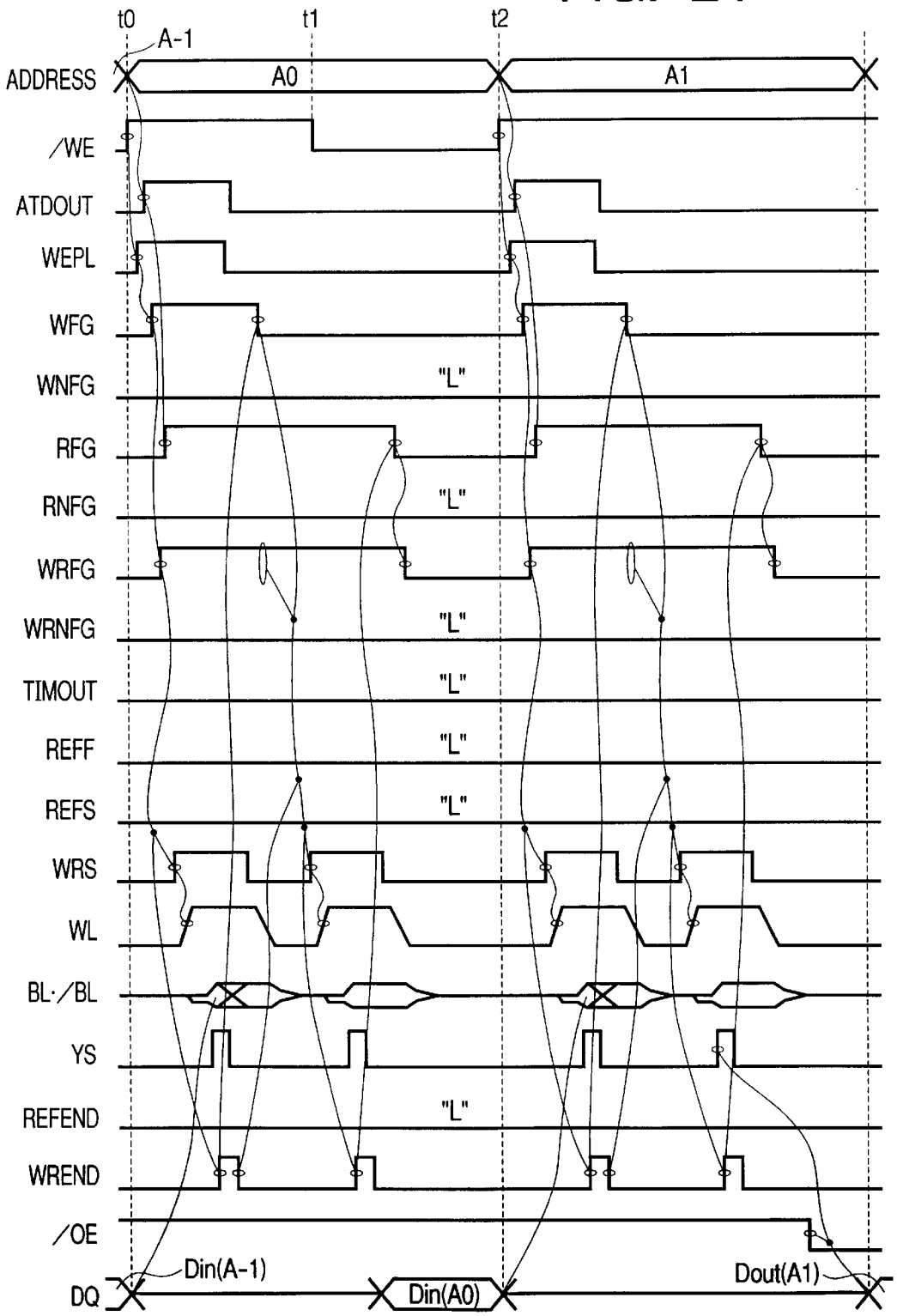
FIG. 24 is a timing chart for describing the first sequence of operations (write—write—read operations) of the embodiment shown in FIG. 10.

FIG. 24 is a timing chart matching the block diagram of FIG. 10. The input pattern of external signals in FIG. 24 follows the pattern of an asynchronous SRAM interface, and in this case the operations are in the sequence of write—write read. The write operation in an asynchronous SRAM interface is defined to be control a (write enable) signal /WE, and the period in which this signal /WE is at L is the write period.

In this embodiment, the write address is taken into the address latch (RAL) 1206 and the column address latch (CAL) 1215 at the beginning of the write period (fall of /WE), and input data are taken into the inside at the end of the write period (rise of /WE). Reading out of the asynchronous SRAM interface, for which there is no particular standard, is started by detecting the transition of the address. If a write operation is started on the way, the read operation is stopped then or, if it cannot be stopped, the write operation is started after the completion of the read operation.

The operations charted in FIG. 24 will be described below. At a point of time t0, the signal /WE rises, and at the same time the address varies from address A-1 to address A0. This results in, first, a write operation into address A-1 and then a read operation out of address A0. At the beginning, a pulse WEPL (write operation) generated upon detecting of the rise of the signal /WE and ATDOUT (read operation) supplied upon detection of the change of the address from A-1 to A0 are entered into the judging circuit (JUDGE) 1220. As the chip is obviously in a selected state then, the timing chart of signals for determining the chip-selected state, such as a chip select signal /CS and the like, is dispensed with. The same applies to any relevant timing chart which would otherwise be shown subsequently.

Then in the judging circuit (FIG. 11), a write operation flag WFG rises in response to the signal WEPL, and a read operation rises in response to the signal ATDOUT. However, in order to give priority to the write operation, the operation flag WFG is disposed to rise earlier than the operation flag RFG. The rise of the operation flags WFC and RFG causes the write/read flag WRFG to rise, and the first arrival judging circuits 1 and 2 (FAJDG1 and 2) 1301 and 1302 are released from their reset state.

The delay circuit (DEL) 1303 in FIG. 11 is inserted for the purpose of preventing any input signal to be entered before the first arrival judging circuits (FAJDG1 and 2) are reset. The delay circuits (DEK) 1304 and 1305 perform similar functions. As the signals WRNFG and REFF are at L when the signal WRFG has risen, the output signals OUT1 and OUT2 of the judging circuit 1 (FAJDG1) 1301 and the judging circuit 2 (FAJDG2) 1302 take on the H level, and the write/read state signal WRS rises. In response to the rise of the signal WRS and that of WFG, a timing needed for a write operation is generated by the timing generation circuit (TIMGEN) 1221, and a word line (WL) matching address A-1 is activated, along with the implementation of bit line (BL) amplification, column (YS) selection, and writing of input data Din (A-1).

Although the write operation is given priority in this case, the read operation may as well be performed. However, control is simpler where priority is given to the write operation. After that, upon the rise of a reset pulse WREND generated by the timing generation circuit (TIMGEN) 1221 and in response to the H state of the operation flag WFG, the operation flag WFG is reset in the judging circuit (FIG. 11). However, as the operation flag WFG is at H, the operation flag WRFG remains at H.

Receiving the reset pulse WREND, the reset pulse WREND is entered into the terminals RST of the first arrival judging circuits 1 and 2 (FAJDG1 and 2) 1301 and 1302. When the terminals RST of the first arrival judging circuits 1 and 2 (FAJDG1 and 2) 1301 and 1302 take on the H level, those output signals once drop to L, and again rise to H when the terminal RST takes on the L level. As a result, the signal WRS, after being once reset, is set again. Upon resetting of the signal WRS, the word lines (WL) are inactivated, and the bit lines (BL) are precharged.

When the signal WRS is set again after that, as the operation flag WFG is at L this time, the timing generation circuit (TIMGEN) 1221 generates a timing required for the read operation, and a word line (WL) matching address A0 is activated, along with the implementation of bit line (BL) amplification, column (YS) selection, and reading of data.

After that, the signal WREND is generated again; the operation flags RFG and WRFG and the output signals WRS of the first arrival judging circuits 1 and 2 (FAJDG1 and 2) 1301 and 1302 are reset; the word lines (WL) are inactivated, and the bit lines (BL) are precharged. At a point of time t1, though the signal /WE takes on the L level, the read operation is executed without interruption. However, data supply to the data terminal DQ is restrained by the L level of the signal /WE.

Next, at a point of time t2, at the same time as the signal /WE takes on the H level, the address varies from A0 to A1. This causes the address A0 to be written into, followed by reading out of A1. Description of these operations is dispensed because they are the same as respectively the writing into address A-1 and reading out of A0 described above. As the cycle of address A1 is a read operation, data are read out in the same as in the read operation in the foregoing cycle of address A0, and after that, in response to the fall of an output enable signal /OE, read data are supplied outside the chip as Dout (A1).

While a timing chart of write—write—read operations was shown in FIG. 24 cited above, description of the timings of consecutive write operations, consecutive read operations and read—write operations is dispensed with because they can be readily inferred from FIG. 24.

Figure 25:
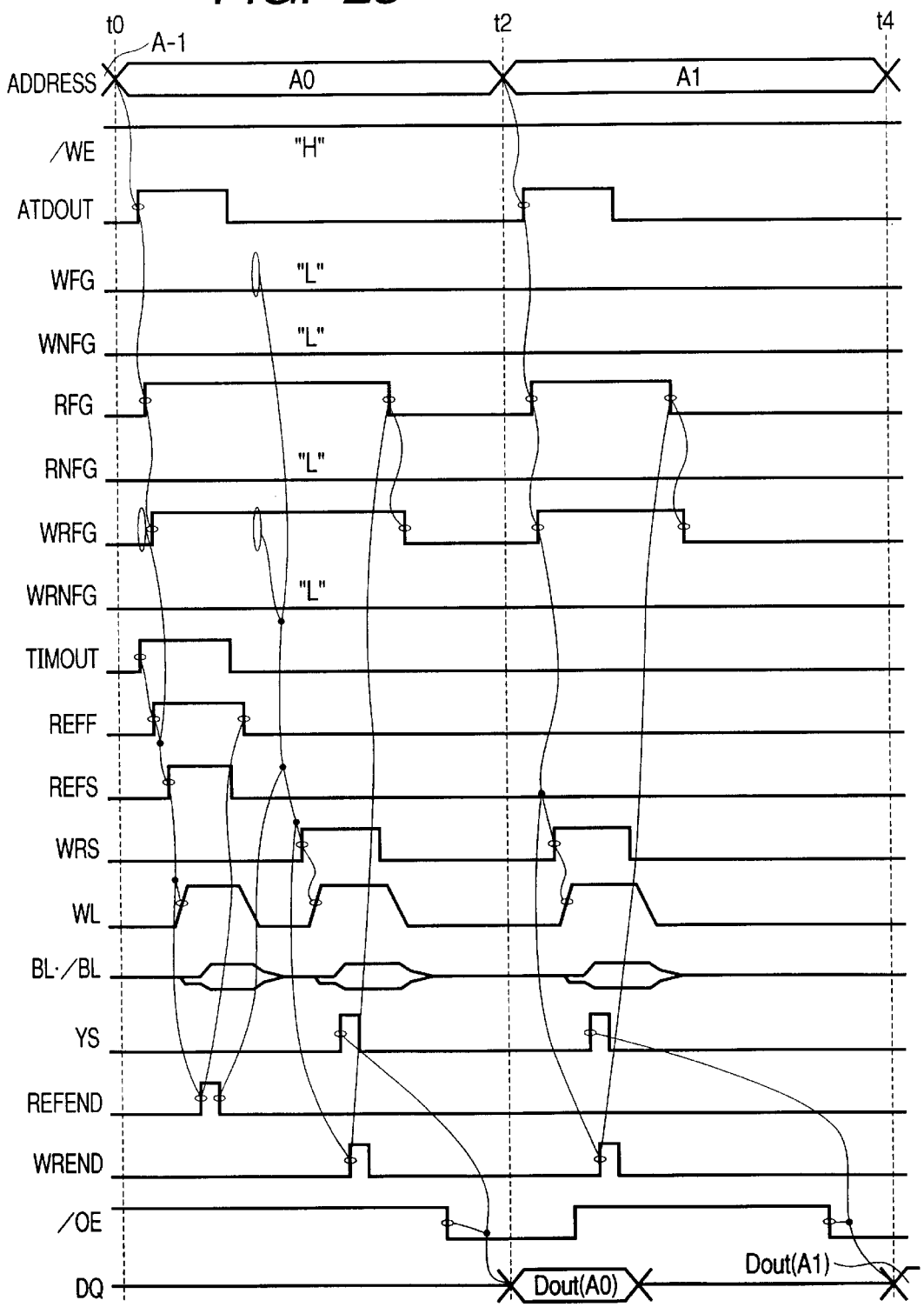
FIG. 25 is a timing chart for describing the second sequence of operations (refresh—write—read operations) of the embodiment shown in FIG. 10.

FIG. 25 is a timing chart matching the block diagram of FIG. 10. Here the operations are performed in a sequence of refresh-write-read. The operations will be described below. At a point of time t0, the address varies from A-1 to A0, and at approximately the same time the timer output takes on the H level. This causes the execution of a refresh operation and a read operation out of address A0 to follow.

First, the timer output signal TIMOUT (refresh operation) and the signal ATDOUT (read operation), which is supplied upon detection of the change of the address from A1 to A0, are entered into the judging circuit (JUDGE) 1220. Within the judging circuit (FIG. 11), the refresh operation flag REFF rises in response to the timer output signal TIMOUT, and the operation flag RFG and the write/read flag WRFG rise in response to the signal ATDOUT. After that, the first arrival judging circuit 2 (FAJDG2) 1302 detects which rose first between the operation flags REFF and WRFG.

According to this timing chart, as the operation flag REFF is supposed to rise first, the output signal OUTR of the first arrival judging circuit 2 (FAJDG2) 1302 takes on the H level, and the refresh state signal REFS rises. In response to the rise of this signal REFS, the timing generation circuit (TIMGEN) 1221 generates a timing needed for the refresh operation, and the activation of the word line (WL) and the amplification of the bit line (BL), both matching the address designated by the address counter (ADC) 1104, are carried out, resulting in the refreshing of memory cell data.

After that, the rise of the reset pulse REFEND generated by the timing generation circuit (TIMGEN) 1220 causes the operation flag REFF to be reset in the judging circuit (FIG. 13). Further in response to the signal REFEND, the signal REFEND is entered into the terminal RST of the first arrival judging circuit 2 (FAJDG2) 1302, with the result that the terminal RST of the first arrival judging circuit 2 (FJDG2) 1302 takes on the H level, the output signals OUT2 and OUTR once take on the L level and, in response to the H level of the operation flag WRFG and the L level of the terminal RST, the output signal OUT2 takes on the H level. By then, the output signal OUT1 of the first arrival judging circuit 1 (FAJDG1) 1301 is already at H. As a result, the signal WRS is set next. When the signal REFS is reset, the word lines (WL) are inactivated, and the bit lines (BL) are precharged. When the signal WRS is set next, as the operation flag WFG is at L in this case, the timing generation circuit (TIMGEN) 1221 generates a timing needed for the read operation; activation of the world line (WL) matching address A0, bit line (BL) amplification, column (YS) selection and data reading are implemented; and data are supplied as Dout (A0) out of the chip in response to the fall of the output enable signal /OE.

After that, the signal WREND is generated; the operation flag RFG and the output signals WRS of the first arrival judging circuits (FAJDG 1 and 2) are reset; the word lines (WL) are inactivated, and the bit lines (BL) are precharged. As the address varies from A0 to A1 at a point of t2, a read operation from A1 is executed. Further description of this cycle will be dispensed with, because it is similar to the read operation of the above-described cycle of address A0.

While the execution was in the sequence of the timing chart of FIG. 25 because the operation flag REFF rose earlier than WRFG, the sequence of execution, conversely, is read—refresh—read if the operation flag WRFG rises first. Description of operations in this case is dispensed with because they can be readily inferred from FIG. 25. Further, if the write enable signal /WE takes on the L level between points of time t2 and t4, a write operation into address A1 will follow, but its description will be dispensed with because the operation is similar to that shown in FIG. 25.

Figure 26:
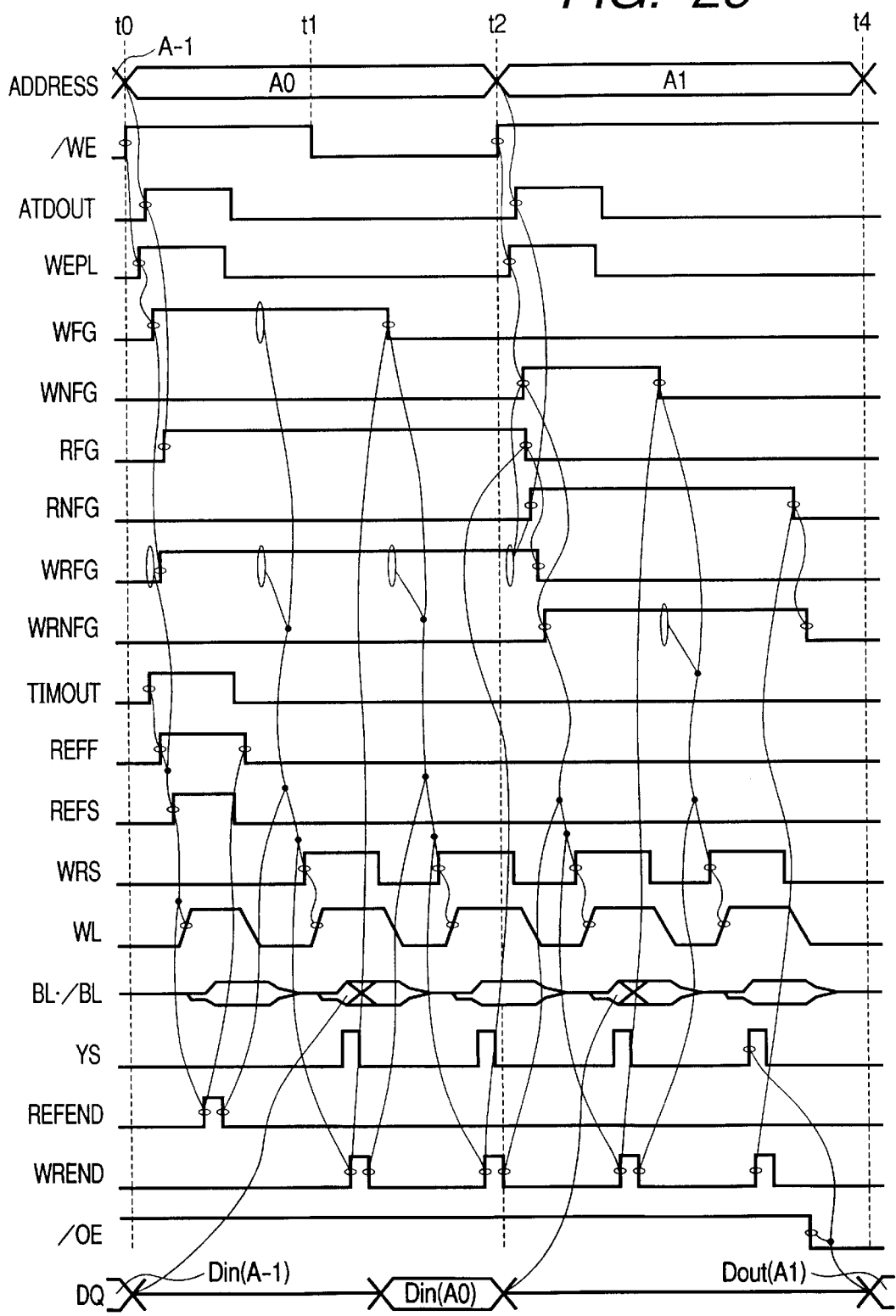
FIG. 26 is a timing chart for describing the third sequence of operations (refresh—write—write—read operations) of the embodiment shown in FIG. 10.

FIG. 26 is a timing chart matching the block diagram of FIG. 10. In this case, the sequence of operations is refresh—write—write—read. The operations will be described below. At a point of time t0, the write enable signal /WE rises, and at the same time the address varies from A-1 to A0. Further, at approximately the same time the timer output TIMOUT takes on the H level. This causes the execution of the refresh operation and the writing operation into address A0 to follow.

First, the timer output signal TIMOUT (refresh operation) and the signal WEPL (write operation), which is generated upon detection of the rise of the signal /WE, and the signal ATDOUT (read operation), which is supplied upon detection of the change of the address from A-1 to A0, are entered into the judging circuit (JUDGE) 1220. Within the judging circuit (FIG. 11), the refresh operation flag REFF rises in response to the timer output signal TIMOUT, the operation flag WFG rises in response to the signal WEPL, and the operation flag RFG rises in response to the signal ATDOUT. However, as the write operation is given priority, the operation flag WFG rises earlier than the operation flag RFG. The rise of the operation flags WFG and RFG causes WRFG to rise.

Next, the first arrival judging circuit (FAJDG2) 1302 detects which of the operation flags REFF and WRFG rose earlier. According to this timing chart, as the operation flag REFF is supposed to rise first, the output signal OUTR of the first arrival judging circuit 2 (FAJDG2) 1302 takes on the H level, and the refresh state signal REFS rises. In response to the rise of this signal REFS, the timing generation circuit (TIMGEN) 1221 generates a timing needed for the refresh operation, and the activation of the word line (WL) and the amplification of the bit line (BL), both matching the address designated by the address counter (ADC) 1104, are carried out, resulting in the refreshing of memory cell data.

After that, the rise of the reset pulse REFEND generated by the timing generation circuit (TIMGEN) 1221 causes the operation flag REFF to be reset in the judging circuit (FIG.

13). Further in response to the signal REFEND, the signal REFEND is entered into the terminal RST of the first arrival judging circuit 2 (FAJDG2) 1302, with the result that the output signal OUTR of the first arrival judging circuit 2 (FJDG2) 1302 once takes on the L level and, in response to the H level of the operation flag WRFG and the L level of the terminal RST, the output signal OUT2 takes on the H level.

By then, the output signal OUT1 of the first arrival judging circuit 1 (FAJDG1) 1301 is already at H. As a result, the signal WRS is set next. When the signal REFS is reset, the word lines (WL) are inactivated, and the bit lines (BL) are precharged. When the signal WRS is set next, as the operation flag WFG is at H in this case, the timing generation circuit (TIMGEN) 1221 generates a timing needed for the write operation; activation of the world line (WL) matching address A-1, bit line (BL) amplification, column (YS) selection and the writing of input data Din (A-1) are implemented.

After that, upon the rise of the reset pulse WREND generated by the timing generation circuit (TIMGEN) 1221 and in response to the H state of the operation flag WFG, the operation flag WFG is reset in the judging circuit (FIG. 13). However, as the operation flag RFG is at H, the operation flag WRFG remains at H. Further, receiving the reset pulse WREND, the reset pulse WREND is entered into the terminals RST of the first arrival judging circuits 1 and 2 (FAJDG1 and 2) 1301 and 1302 with the result that, when the terminals RST of the first arrival judging circuits 1 and 2 (FAJDG1 and 2) 1301 and 1302 take on the H level, the output signals OUT1 and OUT2 of the first arrival judging circuits 1 and 2 (FAJDG1 and 2) 1301 and 1302 once drop to L, and again rise to H when the terminals RST of the first arrival judging circuits 1 and 2 (FAJDG1 and 2) 1301 and 1302 take on the L level.

As a result, the signal WRS, after being once reset, is set again. Upon resetting of the signal WRS, the word lines (WL) are inactivated, and the bit lines (BL) are precharged. When the signal WRS is set again, as the operation flag WFG is at L this time, the timing generation circuit (TIMGEN) 1221 generates a timing required for the read operation, and a word line (WL) matching address A0 is activated, along with the implementation of bit line (BL) amplification, column (YS) selection, and reading of data. After that, the signal WREND is generated again; the operation flags RFG and WRFG and the output signals WRS of the first arrival judging circuits (FAJDG1 and 2) are reset; the word lines (WL) are inactivated, and the bit lined (BL) are precharged.

At a point of time t1, though the write enable signal /WE takes on the L level, the read operation is executed without interruption. However, data supply to the data terminal DQ is restrained by the L level of the signal /WE. Next, at a point of time t2, at the same time as the signal /WE takes on the H level, the address varies from A0 to A1. This causes the address A0 to be written into, followed by reading out of A1. When the address A0 cycle is entered into, again the signal WEPL (write operation), which is generated upon detection of the rise of the signal /WE, and the signal ATDOUT (read operation), which is supplied upon detection of the change of the address from A0 to A-1, are entered into the judging circuit (JUDGE) 1220.

Within the judging circuit (FIG. 13), a write operation second flag WNFG and a read operation second flag WNFG rise in response to the H level of the operation flag WRFG and the signals WEPL and ATDOUT. However, as the write operation is given priority, the operation flag WNFG rises earlier than the operation flags RNFG. The rise of the operation flags WNFG and RNFG causes a write/read second flag WRNFG to rise.

As the signal WREND is entered into the terminal RST of the first arrival judging circuit 1 (FAJDG1) 1301 in response to the aforementioned regeneration of the signal WREND, the output signals OUT1 and OUTN of the first arrival judging circuit 1 (FAJDG1) 1301 once take on the L level and, in response to the H level of the operation flag WRNFG and the L level of the terminal RST of the first arrival judging circuit 1 (FAJDG1) 1301, the output signal OUTN of the first arrival judging circuit 1 (FAJDG1) 1301 takes on the H level.

As a result, the signal WRS is set. Thus, the signal WRS, after being once reset, is set again. When the signal WRS is set again, as the operation flag WNFG is at H this time, the timing generation circuit (TIMGEN) 1221 generates a timing required for the write operation, and a word line (WL) matching address A0 is activated, along with the implementation of bit line (BL) amplification, column (YS) selection, and writing of input data Din (A0). After that, upon the rise of the reset pulse WREND generated by the timing generation circuit (TIMGEN) 1221 and in response to the H state of the operation flag WNFG, the operation flag WNFG is reset in the judging circuit (FIG. 13). However, as the operation flag RNFG is at H, the operation flag WRNFG remains at H.

Further, in response to the signal WREND, the signal WREND is entered into the terminal RST of the first arrival judging circuits 1 (FAJDG1) 1301. When the terminal RST of the first arrival judging circuit 1 (FAJDG1) 1301 takes on the H level, the output signals OUT1 and OUTN of the first arrival judging circuit 1 (FAJDG1) 1301 once drop to L, and the output signal OUTN of the first arrival judging circuit 1 (FAJDG1) 1301 again rises to H when the terminal RST of the first arrival judging circuit 1 (FAJDG1) 1301 takes on the L level. As a result, the signal WRS, after being once reset, is set again. When the signal WRS is reset, the word lines (WL) are inactivated, and the bit lines (BL) are precharged. When the signal WRS is set again, as the operation flag WNFG is at L at this time, the timing generation circuit (TIMGEN) 1221 generates a timing required for the read operation, and a word line (WL) matching address A1 is activated, along with the implementation of bit line (BL) amplification, column (YS) selection, and reading of input data.

After that, the signal WREND is generated again; the operation flags RNFG and WRNFG and the output signals WRS of the first arrival judging circuits (FAJDG 1 and 2) are reset; the word lines (WL) are inactivated, and the bit lines (BL) are precharged. Further, data are supplied as Dout (A1) out of the chip in response to the fall of the output enable signal /OE.

While the sequence of execution was in the timing chart of FIG. 26 was refresh—write—write—read because the operation flag REFF rose earlier than WRFG, the sequence of execution, conversely, is write—refresh—write—read if the operation flag WRFG rises first. Description of operations in this case is dispensed with because they can be readily inferred from FIG. 26. Further, if the write enable signal /WE takes on the L level between points of time t2 and t4, a write operation into address A1 will follow, but its description will be dispensed with because the operation is similar to that shown in FIG. 26.

Figure 27:
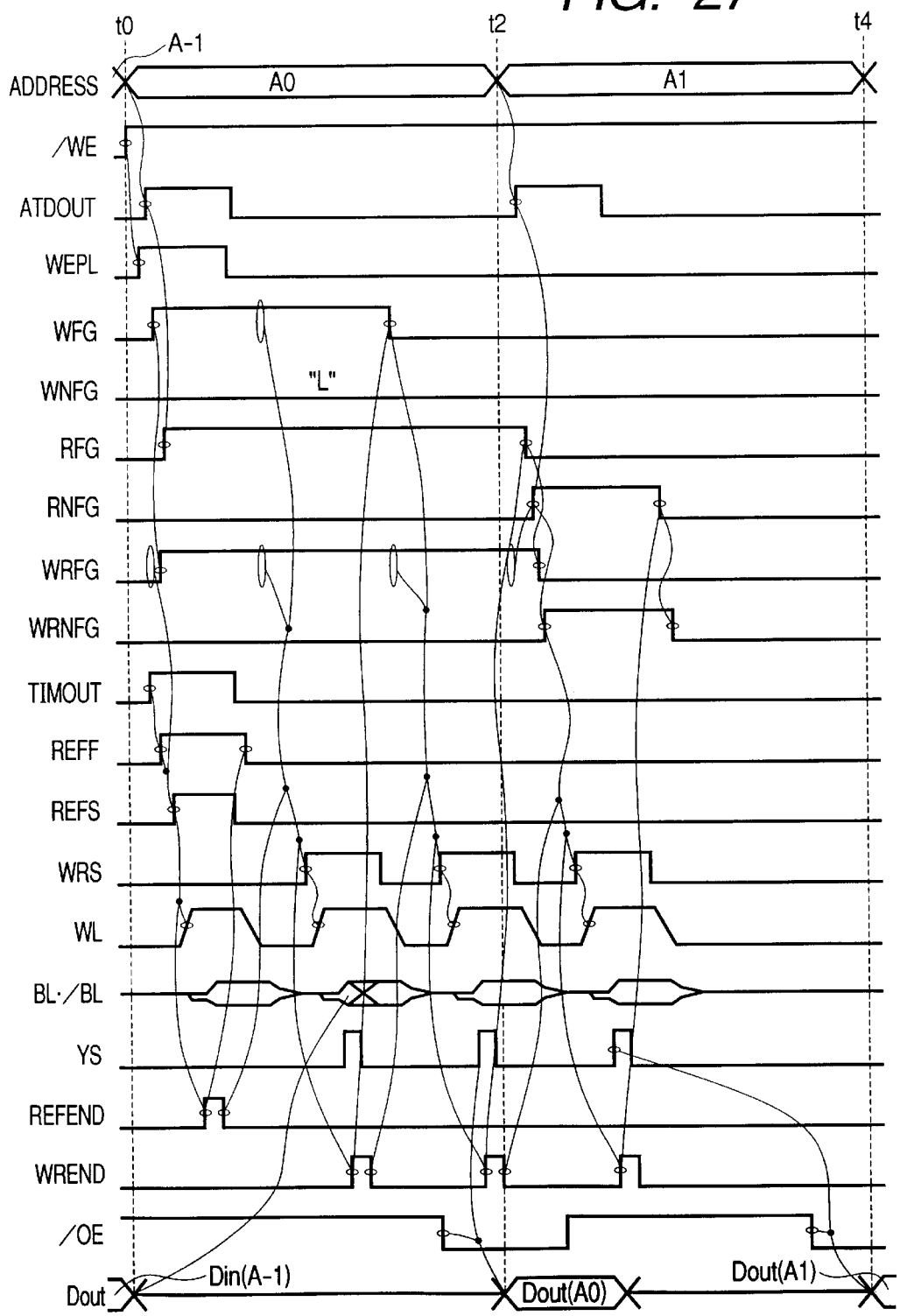
FIG. 27 is a timing chart for describing the fourth sequence of operations (refresh—write—read—read operations) of the embodiment shown in FIG. 10.

FIG. 27 is a timing chart matching the block diagram of FIG. 10. In this case, the sequence of operations is refresh— write—read—read. The operations will be described below. At a point of time t0, the write enable signal /WE rises, and at the same time the address varies from A-1 to A0. Further, at approximately the same time the timer output TIMOUT takes on the H level. This causes the execution of the refresh operation and the writing operation into address A0 to follow.

First, the timer output signal TIMOUT (refresh operation) and the signal WEPL (write operation), which is generated upon detection of the rise of the write enable signal /WE, and the signal ATDOUT (read operation), which is supplied upon detection of the change of the address from A-1 to A0, are entered into the judging circuit (JUDGE) 1220. Within the judging circuit (FIG. 11), the signal REFF rises in response to the timer output signal TIMOUT, the operation flag WFG rises in response to the signal WEPL, and the operation flag RFG rises in response to the signal ATDOUT. However, as the write operation is given priority, the operation flag WFG rises earlier than the operation flag RFG. The rise of the operation flags WFG and RFG causes WRFG to rise.

Next, the first arrival judging circuit (FAJDG2) 1302 detects which of the operation flags REFF and WRFG rose earlier. According to this timing chart, as the operation flag REFF is supposed to rise first, the output signal OUTR of the first arrival judging circuit 2 (FAJDG2) 1302 takes on the H level, and the refresh state signal REFS rises. In response to the rise of the signal REFS, the timing generation circuit (TIMGEN) 1221 generates a timing needed for the refresh operation, and the activation of the word line (WL) and the amplification of the bit line (BL), both matching the address designated by the address counter (ADC) 1104, are carried out, resulting in the refreshing of memory cell data.

After that, the rise of the reset pulse REFEND generated by the timing generation circuit (TIMGEN) 1221 causes the operation flag REFF to be reset in the judging circuit (FIG. 13). Further in response to the signal REFEND, the signal REFEND is entered into the terminal RST of the first arrival judging circuit 2 (FAJDG2) 1302. When the output signal OUTR of the first arrival judging circuit 2 (FJDG2) 1302 takes on the H level, the output signals OUT 2 and OUTR once take on the L level and, in response to the H level of the operation flag WRFG and the L level of the terminal RST of the first arrival judging circuit 2 (FJDG2) 1302, the output signal OUT2 of the first arrival judging circuit 2 (FJDG2) 1302 takes on the H level.

By then, the output signal OUT1 of the first arrival judging circuit 1 (FAJDG1) 1301 is already at H. As a result, the signal WRS is set next. When the signal REFS is reset, the word lines (WL) are inactivated, and the bit lines (BL) are precharged. When the signal WRS is set next, as the operation flag WFG is at H in this case, the timing generation circuit (TIMGEN) 1221 generates a timing needed for the write operation; activation of the world line (WL) matching address A-1, bit line (BL) amplification, column (YS) selection and the writing of input data Din (A-1) are implemented.

After that, upon the rise of the reset pulse WREND generated by the timing generation circuit (TIMGEN) 1221 and in response to the H state of the operation flag WFG, the operation flag WFG is reset in the judging circuit (FIG. 13). However, as the operation flag RFG is at H, the operation flag WRFG remains at H. Further, receiving the signal WREND, the WREND pulse is entered into the terminals RST of the first arrival judging circuits 1 and 2 (FAJDG1 and 2) 1301 and 1302.

When the terminals RST of the first arrival judging circuits 1 and 2 (FAJDG1 and 2) 1301 and 1302 take on the H level, the output signals OUT1 and OUT2 of the first arrival judging circuits 1 and 2 (FAJDG1 and 2) 1301 and 1302 once drop to L, and again rise to H when the terminals RST of the first arrival judging circuits 1 and 2 (FAJDG1 and 2) 1301 and 1302 take on the L level.

As a result, the signal WRS, after being once reset, is set again. Upon resetting of the signal WRS, the word lines (WL) are inactivated, and the bit lines (BL) are precharged. When the signal WRS is set again, as the operation flag WFG is at L this time, the timing generation circuit (TIMGEN) 1221 generates a timing required for the read operation, and a word line (WL) matching address A0 is activated, along with the implementation of bit line (BL) amplification, column (YS) selection, and reading of data. Further, data are supplied as Dout (A0) out of the chip in response to the fall of the output enable signal /OE.

After that, the signal WREND is generated again; the operation flags RFG and WRFG and the output signals WRS of the first arrival judging circuits (FAJDG1 and 2) are reset; the word lines (WL) are inactivated, and the bit lines (BL) are precharged. When the address A1 cycle is entered into, the signal ATDOUT (read operation), which is supplied upon detection of the change of the address from A0 to A1, is entered into the judging circuit (JUDGE) 1220. In the judging circuit (FIG. 13), in response to the H level of the operation flag WRFG and the signal ATDOUT, the operation flags RNFG and WRNFG rise. After that, responding to the generation of the aforementioned signal WREND, the WREND pulse is entered into the first arrival judging circuits 1 and 2 (FAJDG1 and 2) 1301 and 1302.

When the terminals RST of the first arrival judging circuits 1 and 2 (FAJDG1 and 2) 1301 and 1302 take on the H level, the output signals of the first arrival judging circuits 1 and 2 (FAJDG1 and 2) 1301 and 1302 once drop to L, and again rise to H in response to the H level of the operation flag WRNFG and the L level of the terminals RST of the first arrival judging circuits 1 and 2 (FAJDG1 and 2) 1301 and 1302.

As a result, the signal WRS, after being once reset, is set again. When the signal WRS is reset, as the operation flag WNFG is at L at this time, the timing generation circuit (TIMGEN) 1221 generates a timing required for the read operation, and a word line (WL) matching address A1 is activated, along with the implementation of bit line (BL) amplification, column (YS) selection, and reading of data. After that, the signal WREND is generated again; the operation flags RNFG and WRNFG and the output signals WRS of the first arrival judging circuits (FAJDG 1 and 2) are reset; the word lines (WL) are inactivated, and the bit lines (BL) are precharged. Further, data are supplied as Dout (A1) out of the chip in response to the fall of the output enable signal /OE.

While the sequence of execution was in the timing chart of FIG. 27 was refresh—write—read—read because the operation flag REFF rose earlier than WRFG, the sequence of execution, conversely, is write—refresh—read—read if the operation flag WRFG rises first. Description of operations in this case is dispensed with because they can be readily inferred from FIG. 27. Further, if the write enable signal /WE takes on the L level between points of time t2 and t4, a write operation into address A1 will follow, but its description will be dispensed with because the operation is similar to that shown in FIG. 27.

As timings in the total operation pattern can be readily inferred from the timing charts of FIG. 24 through FIG. 27 referred to above, it is seen that the embodiment of the invention shown in FIG. 10 can execute the total operation pattern with no erroneous operation.

In the total operation pattern, what regulates the cycle time is the operation pattern charted in FIG. 27. Now, consider the embodiment of the prior art in the context of FIG. 27. According to the prior art, after the detection of the bit lines BL, the next operation begins with the entry of an external address. As a result, it takes a longer time for a word line WL to rise after the precharging of bit lines BL than according to the invention as is evident from the comparison of FIG. 2 and FIG. 37. As a result, according to the invention as embodied in the operation pattern of FIG. 27, the cycle speed can be enhanced by as much as 20% approximately over the prior art in a 0.15 μm CMOS process.

Figure 28:
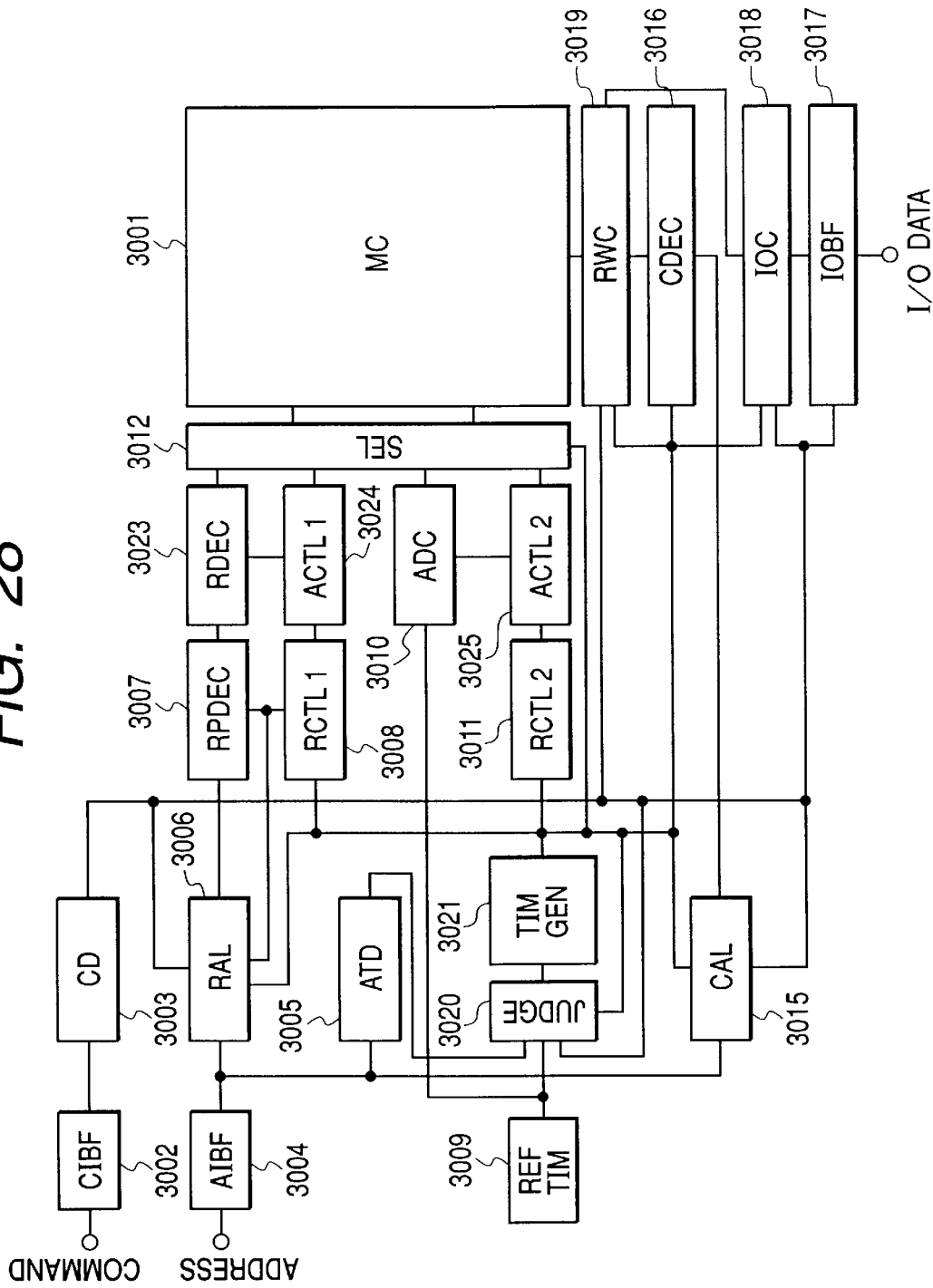
FIG. 28 is a block diagram illustrating a second specific example of the embodiment shown in FIG. 9.

FIG. 28 is a block diagram illustrating a second specific example of the embodiment shown in FIG. 9. This example defers from that in FIG. 10 in that the position of the selector (SEL) 3012 is shifted between a memory array (MC) 3001 and a row decoder (RDEC) 3023. As a result, the address counter (ADC) 1104 in FIG. 10 for counting up the output of the row pre-decoder matching a refresh operation is replaced with an address counter (ADC) 3010 for counting up the output of a row decoder matching a refresh operation, and an array control 2 (ACTL2) 3025 to take charge of array control matching the refresh operation is newly provided. A timing chart for this example is dispensed with because the timing chart for the example of FIG. 10 also applies here.

While in the configuration of FIG. 10 the row decoder (RDEC) 1213 is operated for the refresh operation, the configuration of FIG. 28 can dispense with it because it has the address counter (ADC) 3010. As a result, faster access is made possible in the refresh operation, and electric current consumption can be reduced, too. At the same time, as many selector circuits as the outputs of row decoders are needed, and the array control 2 (ACTL2) 3025 is also required.

Figure 29:
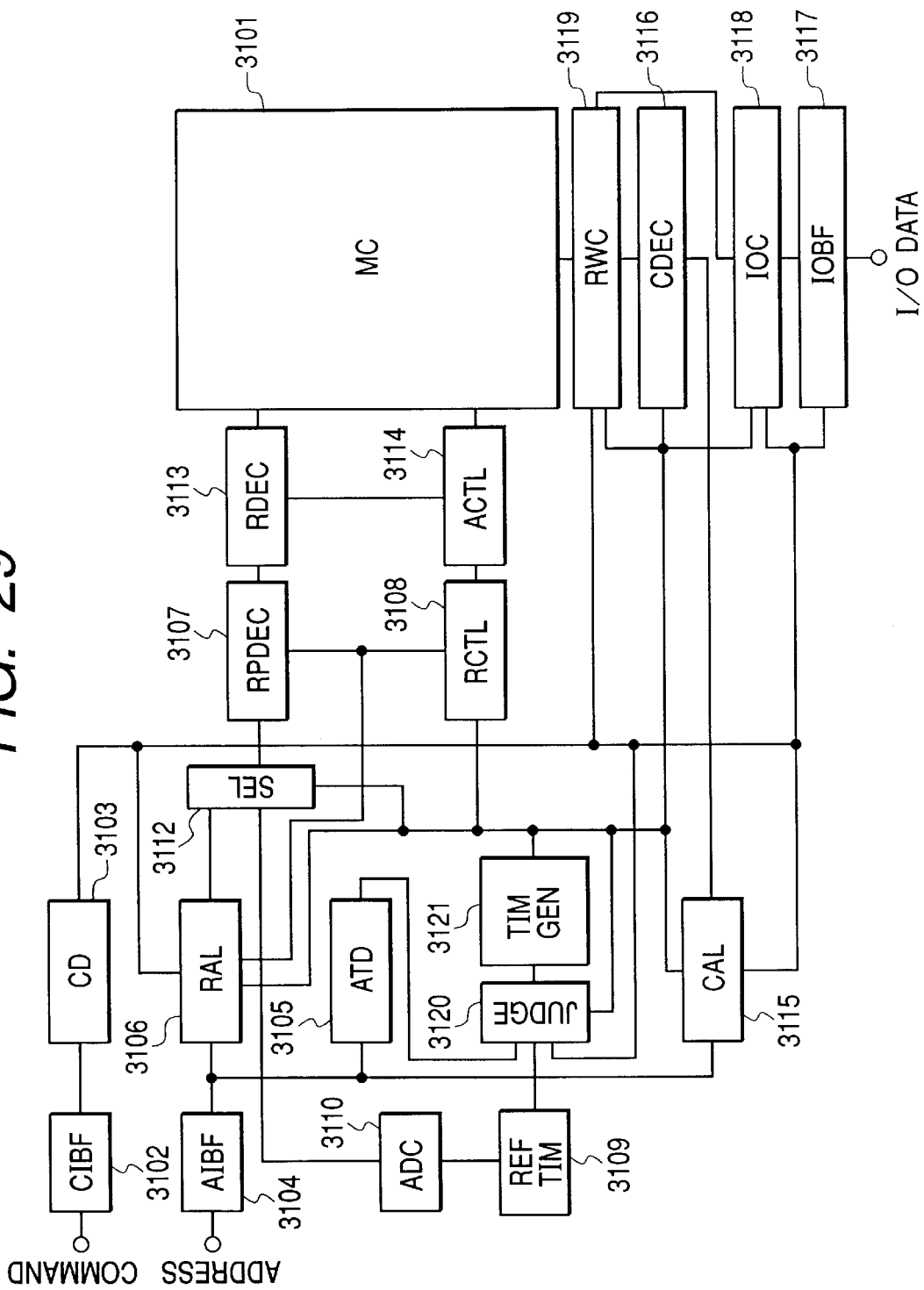
FIG. 29 is a block diagram illustrating a third specific example of the embodiment shown in FIG. 9.

FIG. 29 is a block diagram illustrating a third specific example of the embodiment shown in FIG. 9. The difference from the example of FIG. 10 is that the position of selector (SEL) 3112 is shifted to between a row address latch (RAL) 3106 and a row pre-decoder (RPDEC) 3107. As a result, the controller 2 (RCTL2) 1211 of FIG. 10 is done away with. A timing generation circuit (TIMGEN) 3121, as it is identical with the timing generation circuit (TIMGEN) 1221 of FIG. 10, has outputs to the row controller 1 and the row controller 2. Either one of these outputs is selected according to a flag signal (WRSEL) indicating a write/read operation, supplied from the timing generation circuit (TIMGEN) 3121, and altered to be entered into the row controller (RCTL) 3108. A signal from the row controller (RCTL) 3108 to the row address latch (RAL) 3106 is altered to be supplied only in a write/read operation, because it is unnecessary for a refresh operation. A timing chart for this example is dispensed with because the timing chart for the example of FIG. 10 also applies here.

Compared with the configuration of the example shown in FIG. 10, that in FIG. 29 has a fewer number of selector circuits because the selector (SEL) 3112 is arranged before the row predecoder (RPDEC) 3113, resulting in a reduced chip area. On the other half, the row pre-decoder (RPDEC) 3107 should also be used in the refresh operation.

Figure 30:
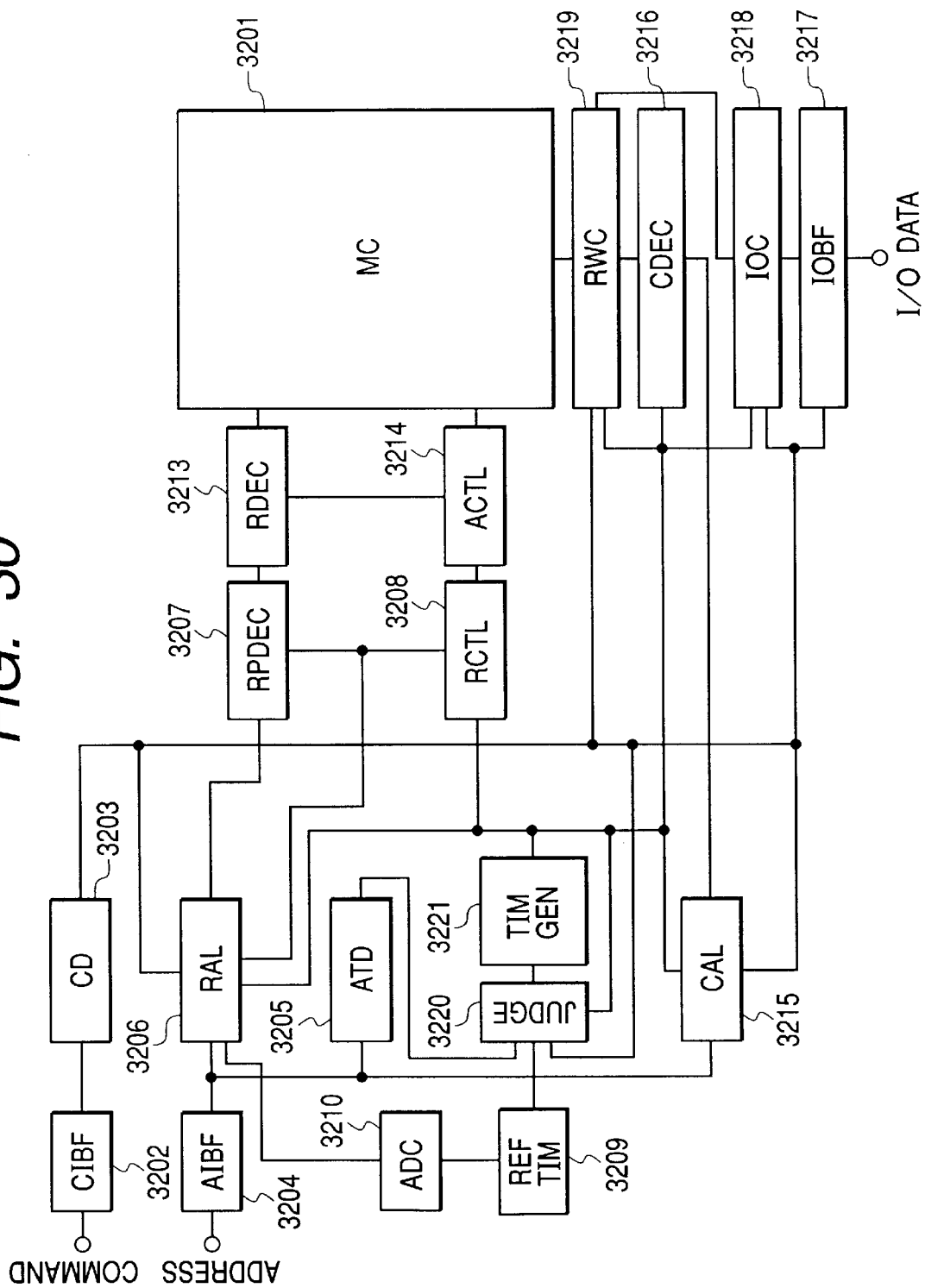
FIG. 30 is a block diagram illustrating a fourth specific example of the embodiment shown in FIG. 9.

FIG. 30 is a block diagram illustrating a fourth specific example of the embodiment shown in FIG. 9. Compared with the example of FIG. 10, the position of the selector is shifted to inside a row address latch (RAL) 3206. As a result, the row controller 2 (RCTL2) 1211 of FIG. 10 is done away with. A timing generation circuit (TIMGEN) 3221, as it is identical with the timing generation circuit (TIMGEN) 1221 of FIG. 10, has outputs to the row controller 1 and the row controller 2. Either one of these outputs is selected according to a flag signal (WRSEL) indicating a write/read operation, supplied from the timing generation circuit (TIMGEN) 3121, and altered to be entered into a row controller (RCTL) 3208.

Figure 31:
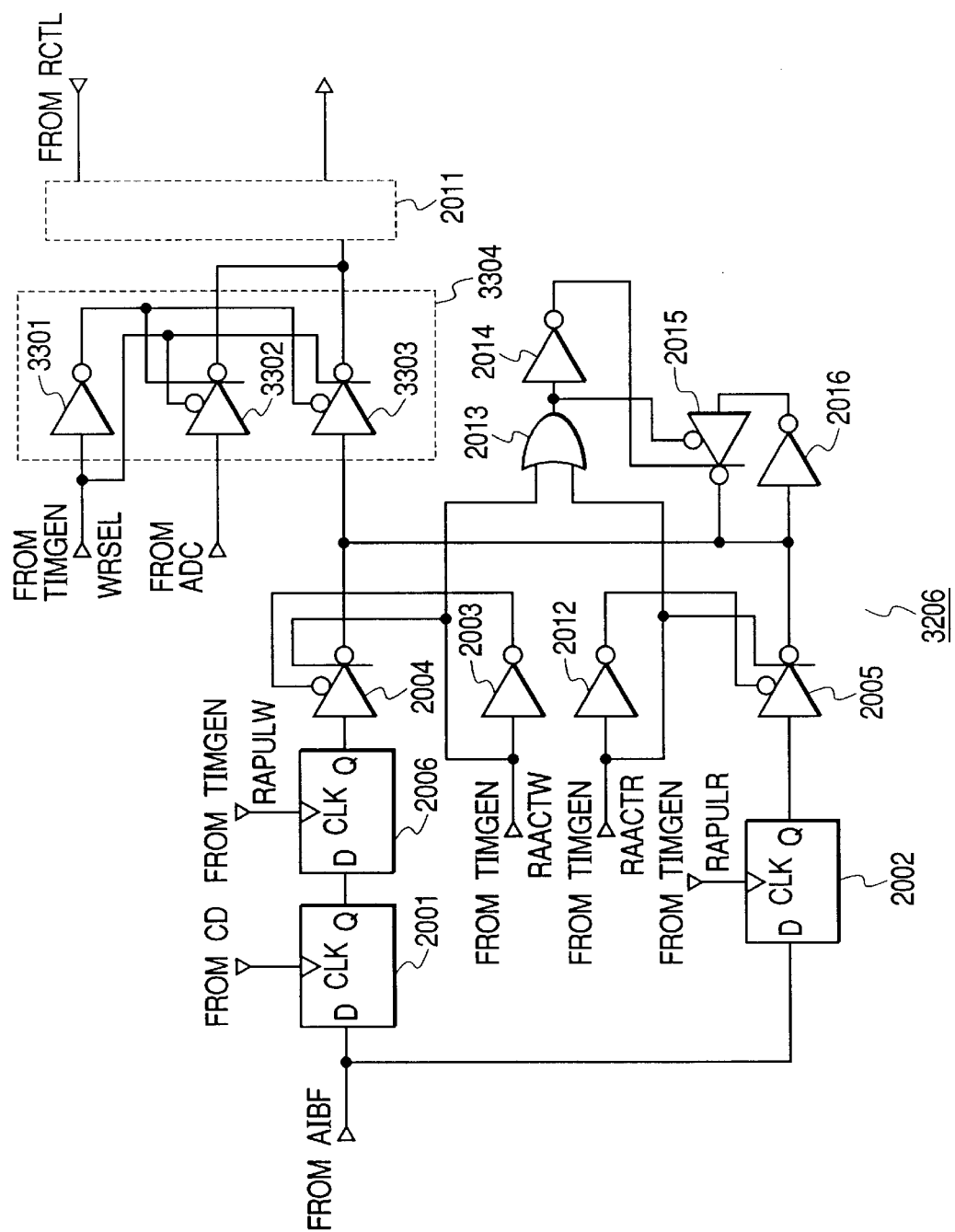
FIG. 31 is a circuit diagram illustrating an example of the row address latch shown in FIG. 30.

FIG. 31 is a circuit diagram illustrating an example of the row address latch (RAL) 3206 shown in FIG. 30. Compared with the address latch (RAL) 1206 in the example of FIG. 18, a selector 3304 is arranged at the stage preceding the row address enable latch 2011. When the output (WRSEK) of the timing generation circuit (TIMGEN) 3221 is at H, it means a write/read operation. in the selector 3304, the output of an inverter 3301 takes on the L level; a clocked inverter 3303 is enabled; a clocked inverter 3302 is disabled; and the output of the clocked inverter 2004 or 2005 is selected.

When the output (WRSEK) of the timing generation circuit (TIMGEN) 3221 is at L, it means a refresh operation. In the selector 3304, the output of the inverter 3301 takes on the H level; the clocked inverter 3303 is disabled; the clocked inverter 3302 is enabled; and the output of an address counter (ADC) 3210 is selected. A timing chart for this example is dispensed with because the timing chart for the example of FIG. 10 also applies here.

Compared with the configuration of the example of FIG. 10, in that of FIG. 30 has a fewer number of selector circuits because the selector (SEL) 3112 is arranged within the row address latch (RAL) 3206. Further compared with the configuration of the example of FIG. 29, the control logic is simplified as much as the dispensation with the control of signals to be supplied from the row controller (RCTL) 3208 to the row address latch (RAL) 3206. As a result, the chip area can be reduced. On the other hand, in the refresh operation, the row address enable latch 2011 and the row pre-decoder (RPDEC) 3207 also have to be used.

While in the example shown in FIG. 10 the timing regulation circuits 3 and 9 (TIMADJ3 and 9) 1506 and 1512 in the timing generation circuit (TIMGEN) 1221 (FIG. 13) are arranged as the delay time measuring circuit (DELMES) 105, they may as well configured like the delay time measuring circuit (DELMES) 505 shown in FIG. 3. In other words, referring to FIG. 10, the configuration may such that a certain signal is received from the row controller 1 or 2 (RCTL1 or 2) 1208 or 1211 or the array control (ACTL) 1214, and a signal resulting from delaying the received signal by an appropriate length of time is returned to the judging circuit (JUDGE) 1220. In this case, the same timing chart as those shown in FIG. 24 through FIG. 27 would apply. Therefore, any detailed description is dispensed with here. Description is also dispensed with the examples shown in FIG. 28, FIG. 29 and FIG. 30, because the same applies to them.

Figure 32:
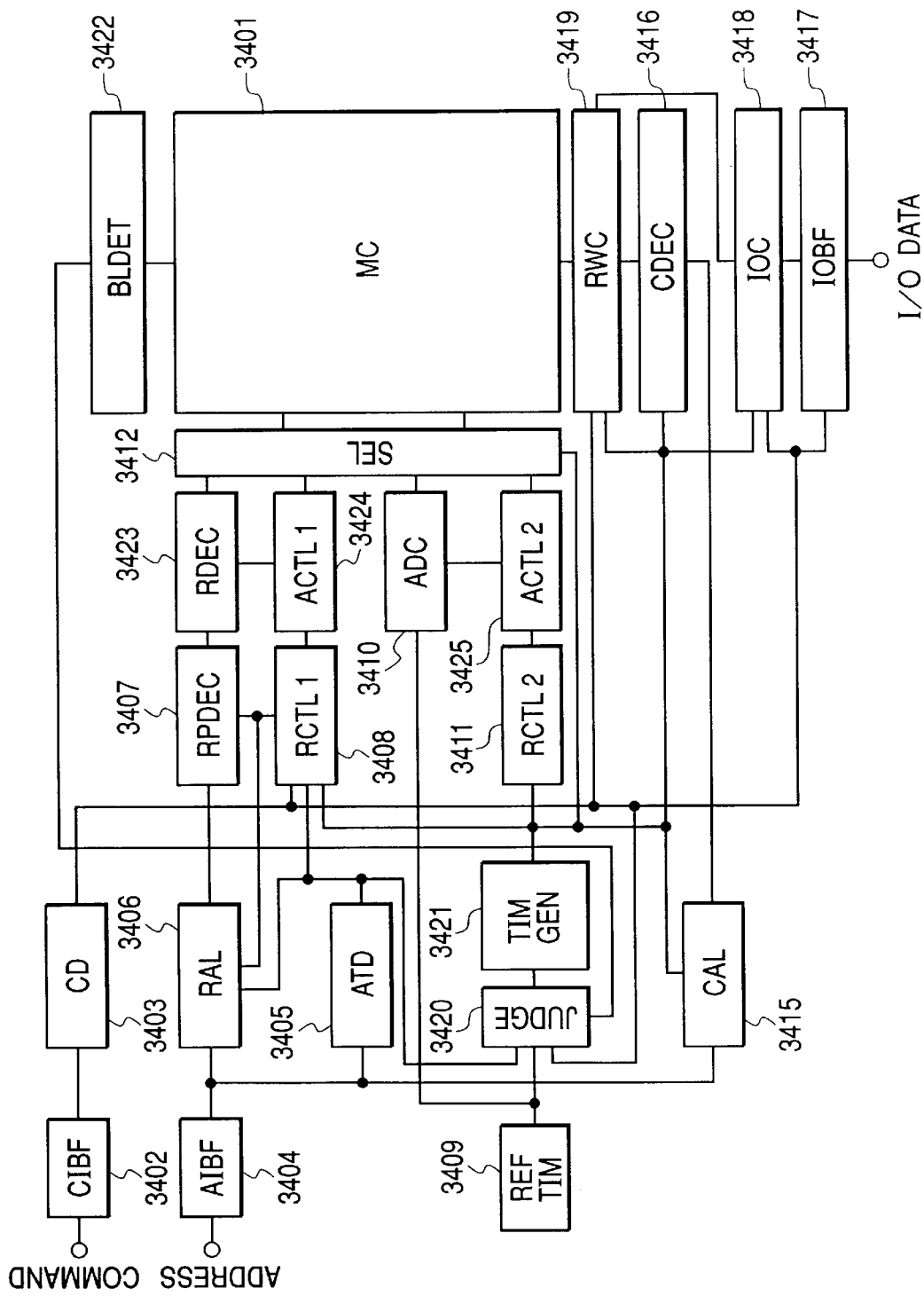
FIG. 32 is a block diagram illustrating a first specific example of the embodiment shown in FIG. 4.

FIG. 32 is a block diagram illustrating a first specific example of the embodiment shown in FIG. 4. A memory cell array (MC) 3401 includes a plurality of word lines, a plurality of bit lines and a plurality of dynamic memory cells, sense amplifiers and sub-word drivers provided to match the lines. An input buffer (CIBF) 3402 receives commands from outside. A command decoder (CD) 3403 decodes entered commands. An input buffer (AIBF) 3404 receives address from outside. An ATD 3405 detects variations in address inputs.

A row address latch (RAL) 3406 latches row addresses. A row pre-decoder (RPDEC) 3407 pre-decodes row addresses.

A row decoder 1 (RDEC1) 3423 decodes the output of the row pre-decoder (RPDEC) 3407. A row controller 1 (RCTL1) 3408 generates control signals for the sense amplifiers and the like, matching the write/read operation. An array control 1 (ACTL1) 3424 controls the operations of the sense amplifiers and the like.

A refresh timer (REFTIM) 3409 generates refresh request pulses of a frequency matching the information holding period of the aforementioned dynamic memory cells. An address counter (ADC) 3410 counts the fresh request pulses and generates a refresh address. A row controller 2 (RCTL2) 3411 generates control signals for the sense amplifiers and the like matching the refresh operation. An array control 2 (ACTL2) 3425 controls the operations of the sense amplifiers and the like.

A selector (SEL) 3412 switches the path according to whether the operation is refresh or write/read. A column address latch (CAL) 3415 latches column addresses. A column decoder (CDEC) 3416 decodes column addresses. An input/output buffer (IOBF) 3417 supplies data read out of the memory cell array (MC) 3401 to outside, and receives data from outside.

An input/output circuit (IOC) 3418 temporarily stores data read out of the memory cell array (MC) 3401, conveys them to the input/output buffer (IOBF) 3417, also temporarily stores external data from the input/output buffer (IONF) 3417, and writes them into the memory cell array (MC) 3401. A read/write circuit (RWC) 3419 conveys to the input/output circuit (IOC) 3418 the data read out of the memory cell array (MC) 3401, and writes into the memory cell array (MC) 3401 write data from the input/output circuit (IOC) 3418.

A judging circuit (JUDGE) 3420 determines the order of precedence in arrival among the output of the command decoder (CD) 3403, that of the ATD 3405 and that of the timer (REFTIM) 3409. A timing generation circuit (TIMGEN) 3421, receiving the output of the judging circuit (JUDGE) 3420, generates a timing to match a refresh, write or read operation. A bit line precharge detection circuit (BLDET) 3422 detects the precharging of bit lines (BL).

The differences from the example of FIG. 10 consist in that the reset signal entered into the judging circuit (JUDGE) 3420 is generated not by the timing generation circuit (TIMGEN) 3421 but by the bit line precharge detection circuit 3422, and that the position of the selector is shifted to between the row decoder and the memory cell array. The example of the bit line precharge detection circuit (BLDET) 3422 in FIG. 32 can consist of the same circuit as its counterpart in the prior art.

As the timing chart of the example shown in FIG. 32 differs from the timing charts (from FIG. 24 through FIG. 27) of the example of FIG. 10 only in the length of time from the precharging of the bit lines (BL) until the rise of the word line (WL) for the next operation, it is abridged in details. In the example shown in FIG. 32, as the precharging of the bit lines (BL) is directly detected, there is no need to allow for any fluctuations attributable to process, voltage or temperature. For this reason, the aforementioned difference in time length is the difference between the time taken until the precharging of the bit lines (BL) and the timing margin α in FIG. 2. If the time taken until the precharging of the bit lines (BL) is shorter than the timing margin α, the cycle time is shorter than the example shown in FIG. 10.

As the example of FIG. 32 needs no pre-decoding of the row address when in a refresh operation, the access time is correspondingly reduced. However, as many selector circuits as signal lines to undergo decoding are required, and the array control 2 (ACTL2) 3425 and the bit line precharge detection circuit (BLDET) 3422 are also needed.

In the following discussion regarding other embodiments of the invention, 3522, 3622, 3722 denote bit line precharge detection circuits (BLDET) that operate similar to 3422.

Figure 33:
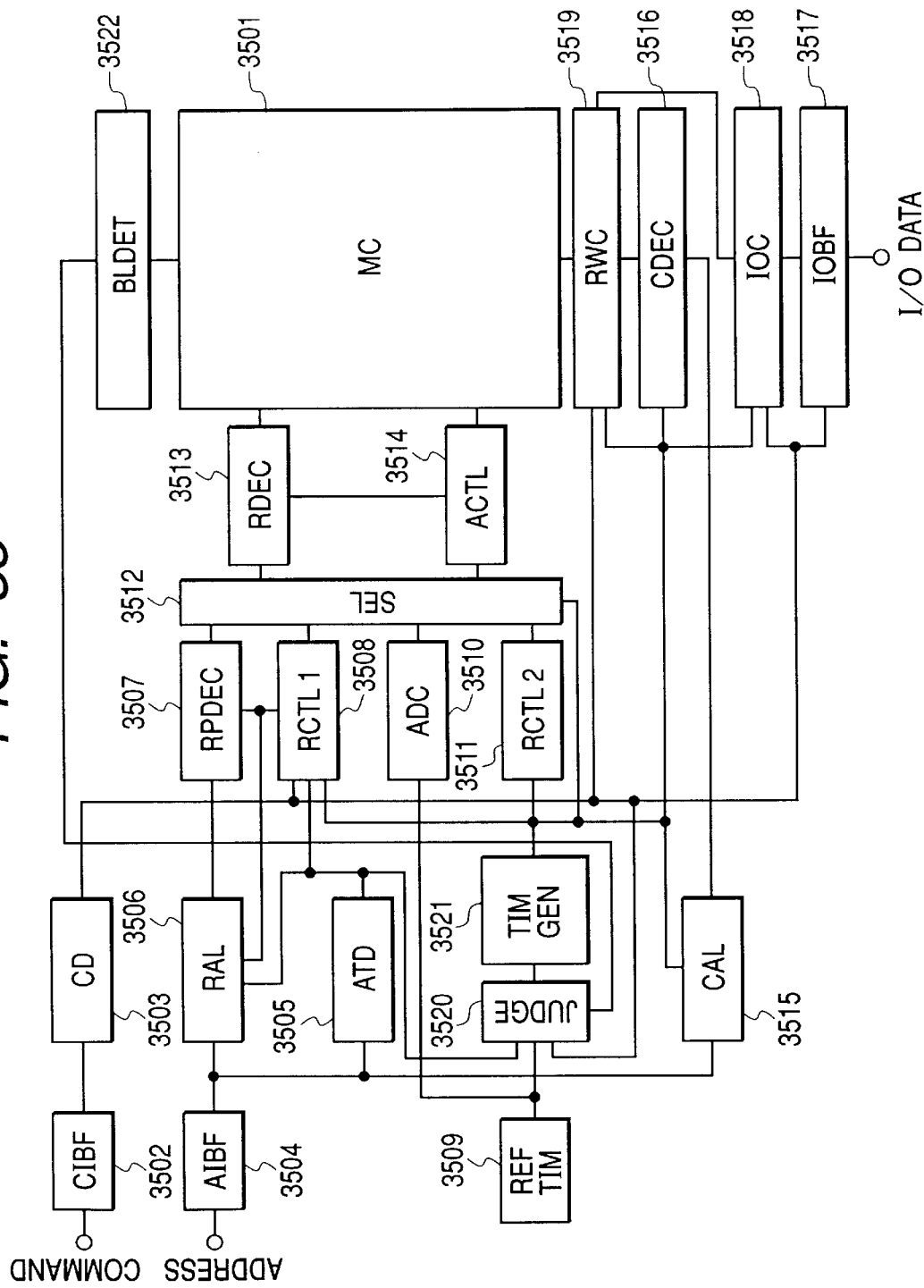
FIG. 33 is a block diagram illustrating a second specific example of the embodiment shown in FIG. 4.

FIG. 33 is a block diagram illustrating a second specific example of the embodiment shown in FIG. 4. Compared with the configuration of the example shown in FIG. 32, the position of the selector is shifted from between the memory cell array and the row decoder to between the row pre-decoder and the row decoder. As a result, only as many selector circuits as signal lines to undergo pre-decoding are required, and only one array control is needed, resulting in reduced circuit dimensions and a corresponding saving in chip area. At the same time, a signal delay time arises from the selector (SEL) 3512 to the row decoder (RDEC) 3513.

As the timing chart of the example shown in FIG. 33 differs from the timing charts (from FIG. 24 through FIG. 27) of the example of FIG. 10 only in the length of time from the precharging of the bit lines (BL) until the rise of the word line (WL) for the next operation, it is abridged in details.

Figure 34:
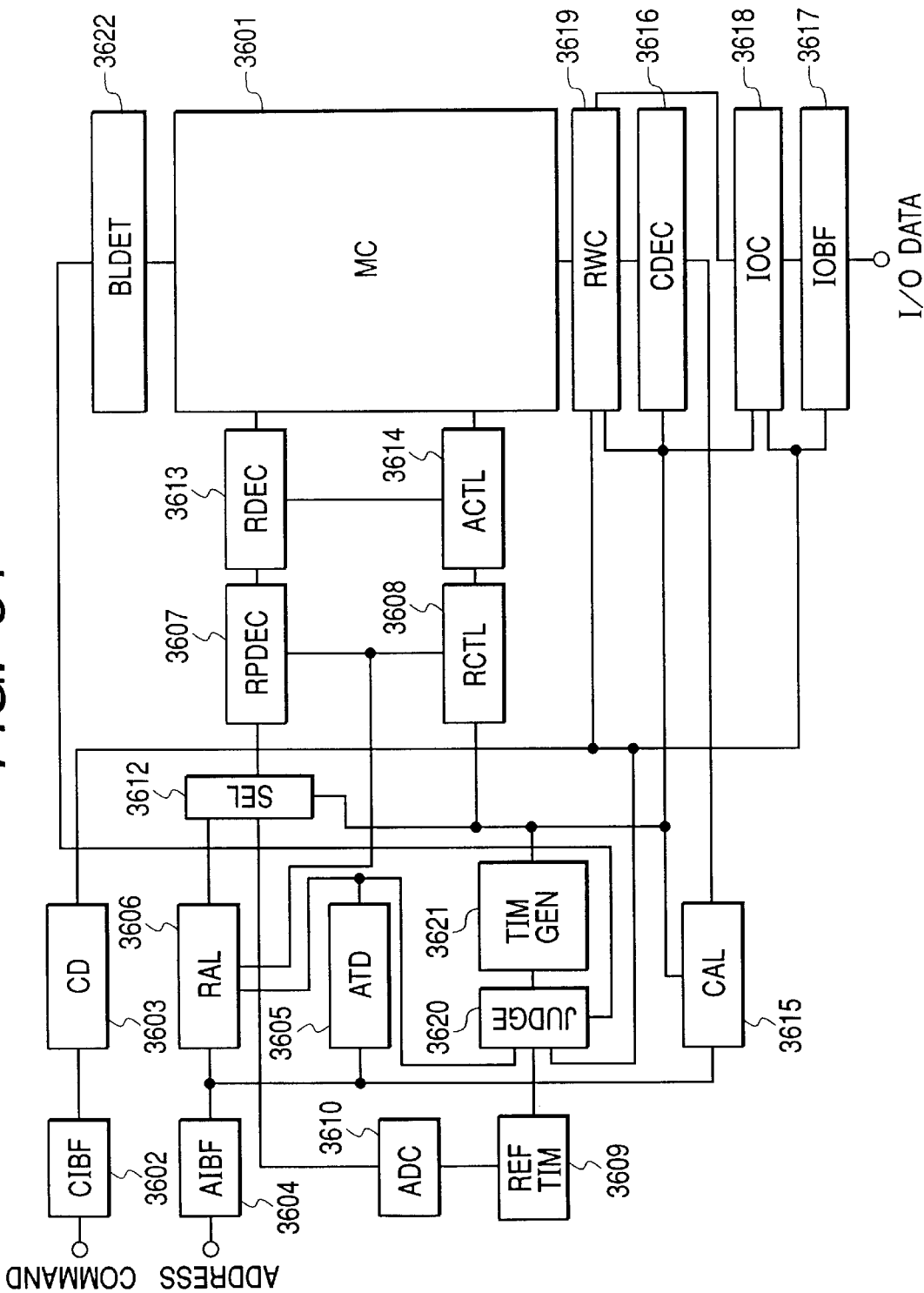
FIG. 34 is a block diagram illustrating a third specific example of the embodiment shown in FIG. 4.

FIG. 34 is a block diagram illustrating a third specific example of the embodiment shown in FIG. 4. Compared with the configuration of the example of FIG. 32, the position of the selector is shifted to between the row address latch and the row pre-decoder. Further, as in the example of FIG. 32, though there are outputs from a timing generation circuit (TIMGEN) 3621 to a row controller 1 and a row controller 2, those outputs are entered into a row controller (RCTL) 3608 of FIG. 34, and either one is selected according to a flag signal supplied from the timing generation circuit (TIMGEN) 3621, indicating a write/read operation. There also is a modification that the signal from the row controller (RCTL) 3608 to the row address latch (RAL) 3606 is supplied only when the operation is write/read.

Compared with the configuration of the example of FIG. 32, in that of FIG. 34, as the selector (SEL) 3612 is arranged before the row pre-decoder (RPDEC) 3607, the number of circuits in the selector need not be greater than the number of signal lines before pre-decoding, and accordingly can be reduced. Moreover, as only one each array control and row controller is required, the chip area can be reduced. However, there arises a delay time from the selector (SEL) 3612 to the row decoder (RDEC) 3613.

Figure 35:
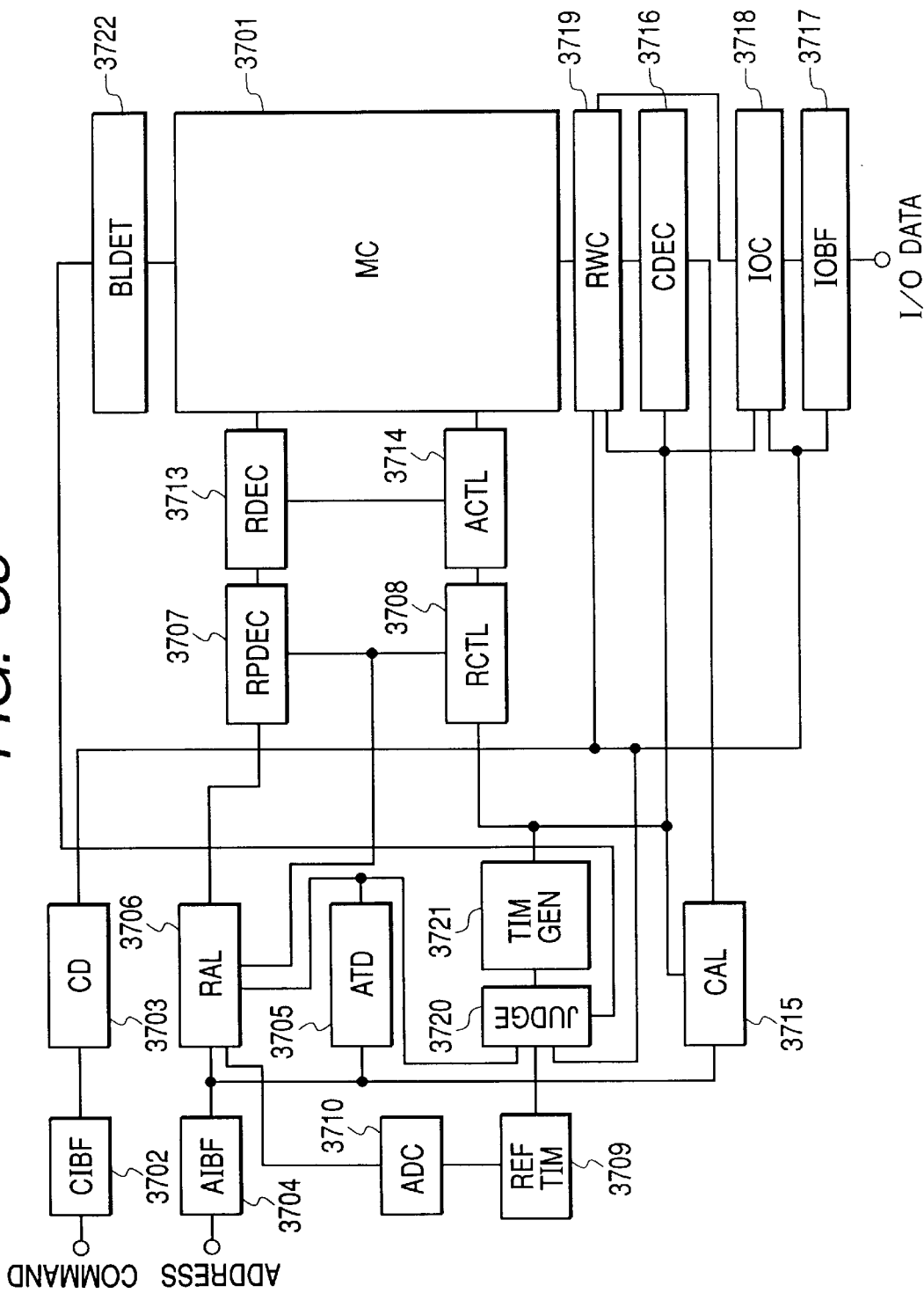
FIG. 35 is a block diagram illustrating a fourth specific example of the embodiment shown in FIG. 4.

FIG. 35 is a block diagram illustrating a fourth specific example of the embodiment shown in FIG. 4. Compared with the example of FIG. 32, the position of the selector is shifted to inside a row address latch (RAL) 3706. As a result, row controller 2 (RCTL2) 3411 and the array controller 2 (ACTL2) 3425 of FIG. 32 are done away with. Furthermore, as in the example of FIG. 32, though there are outputs from a timing generation circuit (TIMGEN) 3721 to a row controller 1 and a row controller 2, those outputs are entered into a row controller (RCTL) 3708 of FIG. 37, and either one is selected according to a flag signal supplied from the timing generation circuit (TIMGEN) 3721, indicating a write/read operation. The configuration of the row address latch (RAL) 3706 is the same as the configuration shown in FIG. 31. The timing chart is dispensed with because it would be the same as that for the example of FIG. 10.

Compared with the configuration of the example of FIG. 32, in the configuration of FIG. 35, as a selector (SEL) 3712 is arranged within the row address latch (RAL) 3706, the number of selector circuits is reduced. Furthermore, compared with the configuration of FIG. 34, the control logic is simplified as much as the dispensation with the control of signals to be supplied from the row controller (RCTL) 3708 to the row address latch (RAL) 3706. As a result, the chip area can be reduced. On the other hand, in the refresh operation, the row address enable latch 2011 and the row pre-decoder (RPDEC) 3207 also have to be used.

Figure 38:
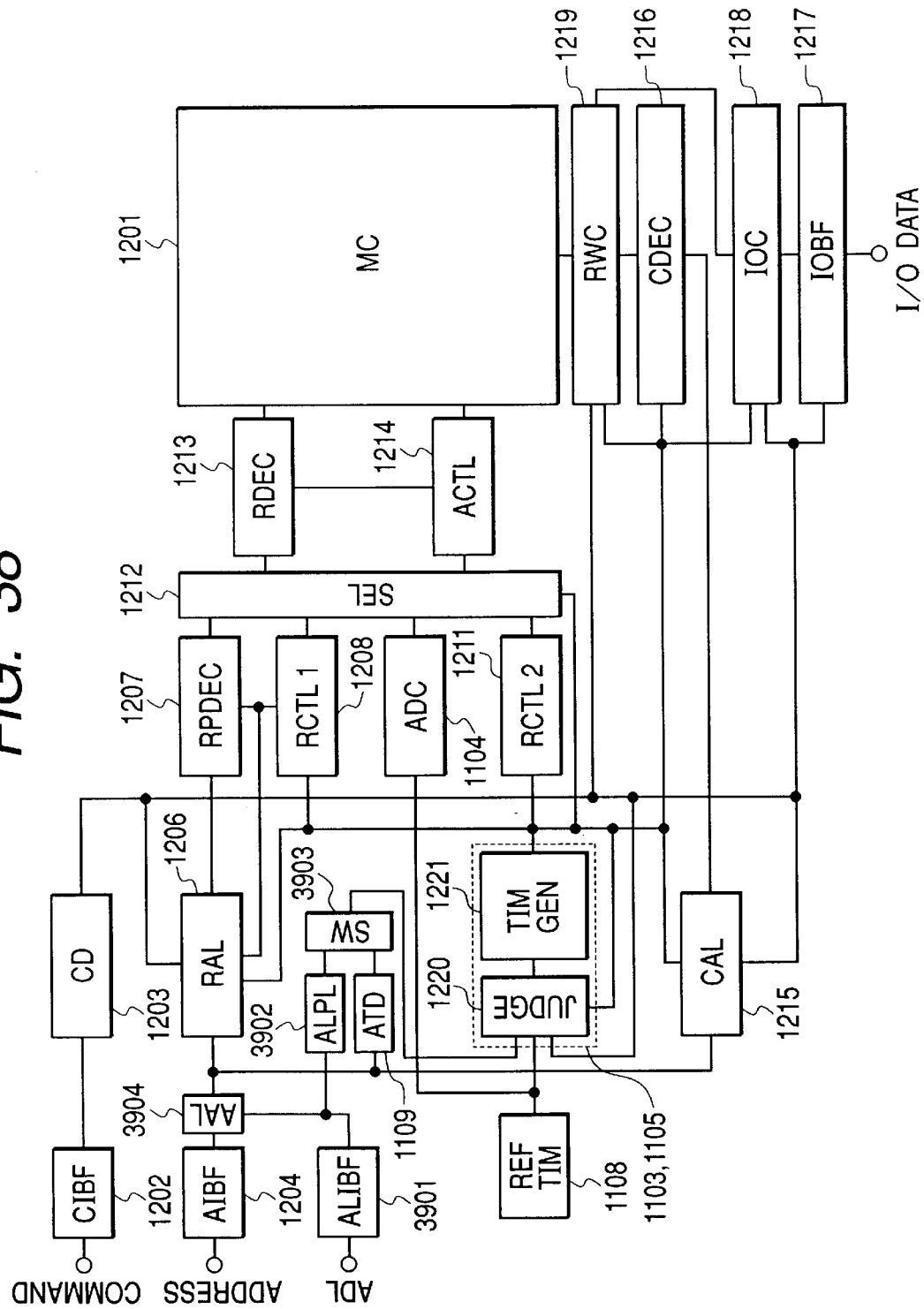
FIG. 38 is a block diagram illustrating a fifth specific example of the embodiment shown in FIG. 9.

FIG. 38 is a block diagram illustrating a fifth specific example of the embodiment shown in FIG. 9. Compared with the example of FIG. 10, this one has an additional signal for latching external addresses (Address). The added signal (address latch signal (ADL)) enters inside through an input buffer (ALIBF) 3901 into an address latch (AAL) 3904 and an ADL pulse generation circuit (ALPL) 3902.

The address latch (AAL) 3904 latches an external address upon the rise of an address latch signal (ADL). The ADL pulse generation circuit (ALPL) 3902 generates a one shot pulse from the rise of the address latch signal (ADL). The output of the ADL pulse generation circuit (ALPL) 3902 enters the judging circuit (JUDGE) 1220 via an ADL switch (SW) 3903.

The judging circuit (JUDGE), as in the example of FIG. 10, determines the order of precedence in arrival among the output of the command decoder (CD) 1203, that of the timer (REFTIM) 1108 and that of the ADL pulse generation circuit (ALPL) 3902, and the timing generation circuit (TIMGEN) 1221, generates a timing to match a refresh, write or read operation. One example of the ADL pulse generation circuit (ALPL) 3902 is shown in FIG. 14.

Figure 39:
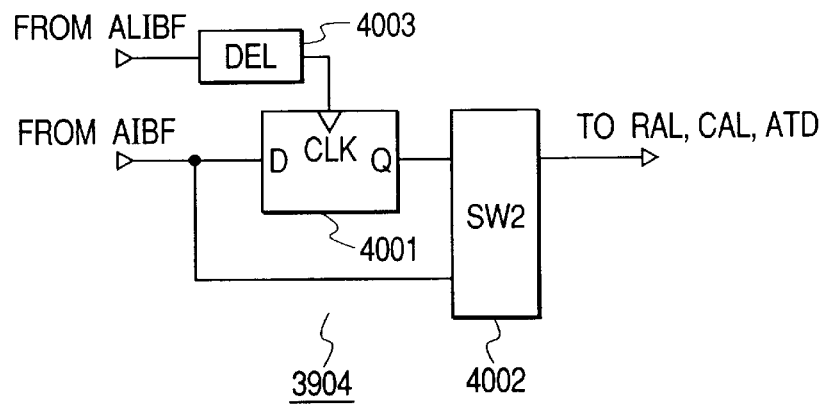
FIG. 39 is a circuit diagram illustrating an example of the address latch shown in FIG. 38.

FIG. 39 is a circuit diagram illustrating an example of the address latch (AAL) 3904 shown in FIG. 38. Where an address latch signal (ADL) is to be validated, the output of a register 4001 is selected with an ADL switch 2 (SW2) 4002, or where an address latch signal (ADL) is to be invalidated, the output of an input buffer (AIBF) is selected. To the latch signal (CLK) of the register 4001 is connected the address latch signal (ADL) via the input buffer (AIBF) and a delay circuit (DEL) for timing regulation. One example of the register 4001 is shown in FIG. 20.

Figure 40:
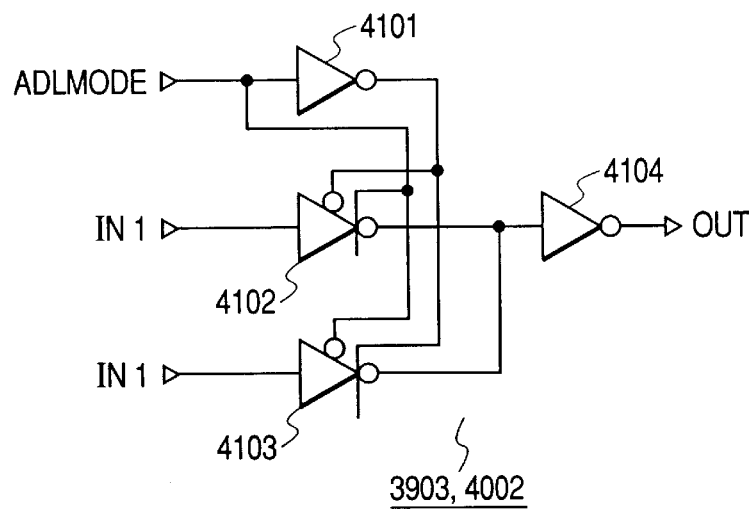
FIG. 40 is a circuit diagram illustrating an example of the ADL switch in FIG. 38 and the ADL switch 2 in FIG. 39.

FIG. 40 is a circuit diagram illustrating an example of the ADL switch (SW) 3903 in FIG. 38 and the ADL switch 2 (SW2) 4002 in FIG. 39. Where the address latch (ADL) is to be validated, raising the ADL judgment signal (ADLMODE) to the H level turns the output of the inverter 4101 to the L level; a clocked inverter 4102 is enabled; a clocked inverter 4103 is disabled; and an input signal 1 (IN1) is supplied via an inverter 4104.

Where the address latch signal (ADL) is to be invalidated, reducing the ADL judgment signal (ADLMODE) to the L level turns the inverter 4101 to the H level; the clocked inverter 4102 is disabled; the clocked inverter 4103 is enabled; and the input signal 2 (IN2) is supplied via the inverter 4104. The input signal (IN1) is connected via the inverter 4104 to the output of the ADL pulse generation circuit (ALPL) 3902 shown in FIG. 38 or the output of the register 4001 in FIG. 39, while the input signal 2 (IN2) is connected to the output of the address variation detection circuit (ATD) 1109 in FIG. 38 or the output of the input buffer (AIBF) in FIG. 39. The ADL judgment signal (ADLMODE) may as well be generated from the command decoder (CD) 1203 by a power-up sequence or the like, or also be fuse cutting, re-connection of a bonding option pin or a metal layer switching.

Figure 41:
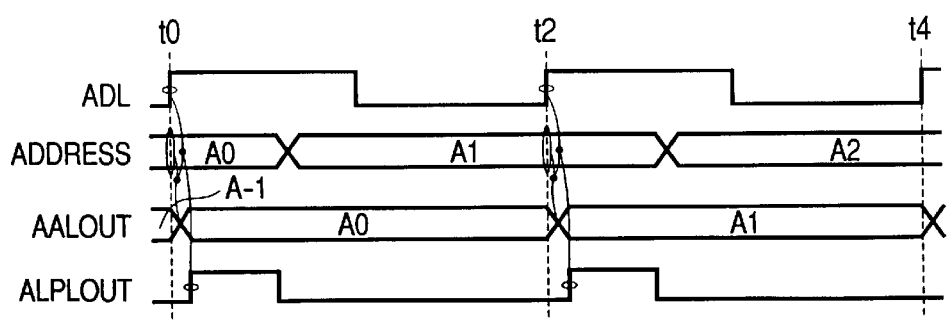
FIG. 41 is a timing chart for describing the operations of the example shown in FIG. 38.

FIG. 41 is a timing chart matching the block diagram of FIG. 38. When the address latch signal (ADL) rises at a point of time t0, an external address (Address) is latched by the address latch (AAK) 3904. The resultant output, which is AALOUT shown in FIG. 41, is entered into the row address latch circuit (RAL) 1206, the column address latch circuit (CAL) 1215 and the address variation detection circuit (ATD) 1109. However, as the address latch signal (ADL) is valid, the output of the address variation detection circuit (ATD) 1109 is intercepted by the ADL switch (SW) 3903.

On the other hand, when the address latch signal (ADL) rises, the ADL pulse generation circuit (ALPL) 3902 generates a one shot pulse (ALPLOUT), and this signal is entered into the judging circuit (JUDGE) 1220 via the ADL switch (SW) 3903. As this one shot pulse (ALPLOUT) is the same signal as the output ADLOUT of the address variation detection circuit (ATD) in FIG. 24 through FIG. 27, all the operations from this point onward are the same as in FIG. 24 through FIG. 27. Therefore, the operation waveforms and description after the one shot pulse (ALPLOUT) are dispensed with.

As timings in the total operation pattern can be readily inferred from the fact that the timing chart of FIG. 38 is the same as that of FIG. 10 at and after the output (ALPLOUT) of the ADL pulse generation circuit (ALPL) (FIG. 24 through FIG. 27). Therefore, it is seen that the embodiment of the invention shown in FIG. 38 can execute the total operation pattern with no erroneous operation.

For the examples shown in FIG. 28 through FIG. 30 and FIG. 32 through FIG. 35, as it is readily inferable that the block diagram and operations where the address latch signal (ADL) can be fully explained as in the case of description with reference to FIG. 38 versus FIG. 10, details are dispensed with here.

In the example of FIG. 38, if an address latch signal (ADL) from outside is inverted and an external address is latched at the trailing edge, operations are also possible. As this can be readily inferred from the foregoing description of the example, details are dispensed with.

Operations are also possible if the address latch signal (ADL) and an external command signal (e.g. a chip select signal) are short-circuited and the external address is latched at the leading edge of the external command signal (e.g. a chip select signal). As this can be readily inferred from the foregoing description of the example, details are dispensed with. In this instance, as it is also possible to short-circuit if the address latch signal (ADL) and the external command signal (e.g. a chip select signal), the above-noted external address latching can be accomplished without increasing the number of pins toward outside the chip.

FIG. 36 illustrates a form of packaging of a chip requiring to realize a semiconductor memory device pertaining to the present invention as described above. FIG. 36 shows a packaging form commonly known as a stacked CSP (chip size package). Reference numeral 3801 denotes a plan, and 3802, a section. It comprises a substrate 3803, a flash memory chip 3804 over the substrate 3803, and the above-described semiconductor memory device according to the invention (a DRAM chip 3805 needing no refreshing from outside) over the flash memory chip 3804, these elements being stacked one over another, and has solder balls 3806 on the under surface of the substrate 3803. However, illustration of bonding wires for connecting electrodes formed over the upper surface of the substrate 3803, the flash memory chip 3804 and electrodes formed over the DRAM chip 3805 is dispensed with to avoid complication of the drawing.

In the package described above, address signals and input/output data signals are connected to the same pins on the substrate with respect to the flash memory and the DRAM needing no refresh from outside to realize the invention. In other words, the pins are shared. Command signals, on the other hand, are connected to different pins on the substrate with respect to the flash memory and the DRAM needing no refresh from outside to realize the invention.

The following advantages are obtained from the foregoing embodiments.

(1) For a DRAM provided with a time multiplexing mode of performing, when a first memory operation to read stored information or write information to be stored is instructed on a memory cell needing a refresh operation to hold stored information, a second memory operation with a different address designation or an autonomous refresh operation before or after such first memory operation, there is achieved the advantage that the cycle time in the time multiplexing mode can be reduced by setting the minimum access time needed for the first memory operation and the second memory operation or the autonomous refresh operation performed before or after the first memory operation shorter than the sum of the length of time required for the first memory operation and that required for the second memory operation or the refresh operation on condition that sets of information stored in the memory cells be not mutually affected in the first memory operation and the second memory operation or the refresh operation.

(2) For a DRAM provided with a time multiplexing mode of performing, when a first memory operation to read stored information or write information to be stored is instructed on a memory cell needing a refresh operation to hold stored information, a second memory operation with a different address designation or an autonomous refresh operation before or after such first memory operation, such second memory operation or refresh operation compete for the same time segment with the first memory operation, there is achieved the advantage that the cycle time in the time multiplexing mode can be reduced by setting the minimum access time needed for the first memory operation and the second memory operation or the autonomous refresh operation performed before or after the first memory operation shorter than the sum of the length of time required for the first memory operation and that required for the second memory operation or the refresh operation on condition that sets of information stored in the memory cells be not mutually affected in the first memory operation and the second memory operation or the refresh operation.

(3) In addition to the above-described, there is achieved the advantage that the cycle time can be reduced in the time multiplexing mode by performing in parallel preparations for the selection of a word line for the operation to be executed later, out of the first memory operation and the second memory operation or the refresh operation, during the period of the earlier executed operation.

(4) In addition to the above-described, there is achieved the advantage that stored information in the memory cells can be kept unaffected by each other and the cycle time can be reduced in the time multiplexing mode by setting the rise of the word line for the operation to be executed later, out of the first memory operation and the second memory operation or the refresh operation, after the completion of word line resetting and bit line precharging for the earlier executed operation.

(5) In addition to the above-described, there is achieved the advantage that the preparations can be performed in advance and the cycle time can be reduced in the time multiplexing mode by starting the operation to be executed later with an actuation signal formed by delaying the signal instructing the first memory operation with a prescribed delay circuit.

(6) In addition to the above-described, there is achieved the advantage that the timing margin can be reduced while simplifying the circuitry by using for the control the operation to be executed earlier a signal for detecting the precharging of the bit line to be used for the operation to be executed earlier.

(7) A time-multiplexing control circuit is provided to allocate a time segment, when a first memory operation on any of the memory cells constituting a DRAM to read or write stored information or information to be stored is instructed, for performing a second memory operation or the refresh operation, having a different address designation from the first memory operation, after the first memory operation, wherein the time-multiplexing control circuit allocates time segments for a first operation to release the bit lines from the precharge in accordance with the instruction of the first memory operation and to read information in the memory cell or write external information into the memory cell by performing operations to select a word line and a bit line in accordance with the address signal in the first memory operation, a first precharge operation to precharge the bit lines again, and for the second memory operation or the refresh operation by releasing the bit lines from the precharge and select a word line matching the second memory operation or the refresh operation, executes preparatory operations including decoding for the selection of a word line matching the second memory operation or the refresh operation in parallel with the first operation or first precharge operation, and allocates time segments for the second memory operation or the refresh operation so that the selection of the word line matching the second memory operation or the refresh operation may not overlap the first precharge operation, resulting in the advantage of increasing the speed of memory accessing.

(8) A time-multiplexing control circuit is provided to allocate a time segment, when a first memory operation on any of the memory cells constituting a DRAM to read or write stored information or information to be stored is instructed, for allocating a time segment for performing a refreshing operation before the first operation, wherein a time segment is allocated for performing the refreshing operation to release the bit lines from the precharge in accordance with the instruction of the first memory operation, to read information in the memory cells onto a bit line by performing operations to select a word line matching the refresh address, and amplify and rewrite the read information; an operation is performed to read information in the memory cells or write external information into the memory cells by performing selection of a word line and a bit line in accordance with the address signal in the first memory operation after the first precharge operation to precharge the bit lines again; preparatory operations including decoding for selecting a word line matching the operation to read information in the memory cells or write external information into the memory cells are performed in parallel with the first precharge operation; and the selection of the word line matching such operation is prevented from overlapping the first precharge operation, resulting in the advantage of increase the speed of memory accessing.

(9) In addition to the above-described, there is achieved the advantage of reducing the current consumption needed for refreshing by performing a refresh operation only when refresh request is received in the time segment allocated for the refresh operation.

(10) In addition to the above-described, there is achieved the advantage that the address selecting circuit is so configured that a first selecting circuit decodes an address signal entered to match a first memory operation and thereby to form a selection signal for a word line, a second selecting decodes a refresh address signal and form a selection signal for a matching word line, and a selector is caused to select either the output signal of the first selecting circuit or the out put signal of the second selecting circuit to have a word line selected, with the result that the time margin for address selection can be set to the minimum and the memory cycle time can be shortened accordingly.

(11) In addition to the above-described, there is achieved the advantage that, by having a refresh address signal formed by a refresh address generating circuit consisting of a counter circuit receiving periodic pulse signals, reliable refreshing operations can be performed, matching the duration of information holding by memory cells.

The invention by the present inventor has been specifically described above with reference to embodiments thereof, but obviously the invention under the present application is not limited to the foregoing embodiments, and can be modified in various ways without deviating from the essentials thereof. For instance, referring to FIG. 10, the memory cell array 1021 may be divided into a plurality of sub-arrays in the directions of the bit lines and the word lines, with a plurality of address selecting circuits provided for the divided sub-arrays of memory cells. The word lines and bit lines can be arranged in a hierarchical word line system consisting of main word lines and local word lines and a hierarchical bit line system consisting of main bit lines and local bit lines.

Thus, the memory cell arrays and their address selecting circuits can be configured by utilizing element structures and circuit layout techniques adopted for known dynamic RAMs.

Along with the functional advancement of electronic devices including mobile telephones, the demand for large capacity work RAMs is dramatically increasing. Usually a work RAM is made up of an asynchronous SRAM, which is not suitable for achieving a large capacity. As an alternative, large capacity RAMs are attracting note, but they need refreshing and accordingly are inconvenient. A semiconductor according to the present invention can maintain compatibility with asynchronous SRAMs and a configuration integrating this device with the above-mentioned flash memory can accomplish various memory operations through combination with flash memories having nonvolatile memory functions at the time of power failure. This invention offers extensively usable semiconductor memory devices that can be similarly handled to SRAMs from outside while utilizing DRAM circuits as so far described.

To briefly summarize a typical aspect of the present invention disclosed in this application, memory cells periodically needing a refresh operation to hold stored information are provided with a time-multiplexing mode of performing, when a first memory operation on a memory cell to read or write stored information or information to be stored and performing a second memory operation, having a different address designation from the first memory operation, or a refresh operation compete for the same time segment, the second memory operation or the refresh operation before or after the first memory operation, wherein the minimum access time needed for the first memory operation and the second memory operation or the refresh operation performed before or after the first memory operation is set shorter than the sum of the length of time required for the first memory operation and that required for the second memory operation or the refresh operation on condition that sets of information stored in the memory cells be not mutually affected in the first memory operation and the second memory operation or the refresh operation, resulting the advantage of shortening the cycle time in the time-multiplexing mode.

A time-multiplexing control circuit is provided to allocate a time segment, when a first memory operation on any of the memory cells constituting a DRAM to read or write stored information or information to be stored is instructed, for performing a second memory operation or the refresh operation, having a different address designation from the first memory operation, after the first memory operation, wherein the time-multiplexing control circuit allocates time segments for a first operation to release the bit lines from the precharge in accordance with the instruction of the first memory operation and to read information in the memory cell or write external information into the memory cell by performing operations to select a word line and a bit line in accordance with the address signal in the first memory operation, a first precharge operation to precharge the bit lines again, and for the second memory operation or the refresh operation by releasing the bit lines from the precharge and select a word line matching the second memory operation or the refresh operation, executes preparatory operations including decoding for the selection of a word line matching the second memory operation or the refresh operation in parallel with the first operation or first precharge operation, and allocates time segments for the second memory operation or the refresh operation so that the selection of the word line matching the second memory operation or the refresh operation may not overlap the first precharge operation, resulting in the advantage of increasing the speed of memory accessing.

What is claimed is:

1. A semiconductor memory device comprising at least one memory cell periodically needing a refresh operation to hold stored information; and a time multiplexing circuit, wherein when a first memory operation on said memory cell to read stored information or to write information to be stored is instructed, said time multiplexing circuit performs one of a second memory operation having a different address designation from the first memory operation and an autonomous refresh operation before or after the first memory operation, and an access time period needed for the first memory operation and said one of the second memory operation and the autonomous refresh operation is set shorter than a sum of a first time period required for the first memory operation and a second time period required for said one of the second memory operation and the refresh operation, and sets of information stored in the memory cell in the first memory operation and in said one of the second memory operation and the refresh operation are not mutually affected.

2. The semiconductor memory device according to claim 1, wherein preparations for selecting a word line for an early-in-time operation out of the first memory operation and said one of the second memory operation and the refresh operation is carried out partially in parallel with preparations for selecting a word line for a later-in-time operation out of the first memory operation and said one of the second memory operation and the refresh operation.

3. The semiconductor memory device according to claim 1, wherein a voltage of a selected word line for a later-in-time operation out of the first memory operation and said one of the second memory operation and the refresh operation is raised after the selected word line is reset and a selected bit line is precharged for an early-in-time operation out of the first memory operation and said one of the second memory operation and the refresh operation.

4. The semiconductor memory device according to claim 1, further comprising a delay circuit, wherein a later-in-time operation out of the first memory operation and said one of the second memory operation and the refresh operation is started with an actuation signal output form the delay circuit and formed by delaying a signal instructing said first memory operation.

5. The semiconductor memory device according to claim 1, wherein a later-in-time operation out of the first memory operation and said one of the second memory operation and the refresh operation is controlled with a signal for detecting a time for starting precharging a selected bit line for said later-in-time operation.

6. The semiconductor memory device according to claim 2, wherein a voltage of a selected word line for a later-in-time operation out of the first memory operation and said one of the second memory operation and the refresh operation is raised after the selected word line is reset and a selected bit line is precharged for an early-in-time operation out of the first memory operation and said one of the second memory operation and the refresh operation.

7. A semiconductor memory device comprising a plurality of memory cells periodically needing a refresh operation to hold stored information; and a time multiplexing circuit, wherein when a first memory operation to access said plurality of memory cells on the basis of a first address signal and one of a second memory operation to access said plurality of memory cells on the basis of a second address signal and an autonomous refresh operation competes for one time segment, said time multiplexing circuit allocates said one of the second memory operation and the refresh operation before the first memory operation, a sum of a series of access time periods needed for said first memory operation and for said one of the second memory operation and the refresh operation is set shorter than a sum of a first time period required for the first memory operation and a second time period required for said one of the second memory operation and the refresh operation.

8. The semiconductor memory device according to claim 7, wherein said second memory operation is a refresh operation.

9. The semiconductor memory device according to claim 8, wherein said first memory operation is a usual access operation.

10. The semiconductor memory device according to claim 7, wherein preparations for selecting a word line for an early-in-time operation out of the first memory operation and said one of the second memory operation and the refresh operation is carried out partially in parallel with preparations for selecting a word line for a later-in-time operation out of the first memory operation and said one of the second memory operation and the refresh operation.

11. The semiconductor memory device according to claim 10, wherein a voltage of a selected word line for a later-in-time operation out of the first memory operation and said one of the second memory operation and the refresh operation is raised after the selected word line is reset and a selected bit line is precharged for an early-in-time operation out of the first memory operation and said one of the second memory operation and the refresh operation.

12. The semiconductor memory device according to claim 7, wherein a voltage of a selected word line for a later-in-time operation out of the first memory operation and said one of the second memory operation and the refresh operation is raised after the selected word line is reset and a selected bit line is precharged for an early-in-time operation out of the first memory operation and said one of the second memory operation and the refresh operation.

13. The semiconductor memory device according to claim 7, further comprising a delay circuit, wherein a later-in-time operation out of the first memory operation and said one of the second memory operation and the refresh operation is started with an actuation signal output form the delay circuit and formed by delaying a signal instructing said first memory operation.

14. The semiconductor memory device according to claim 7, wherein a later-in-time operation out of the first memory operation and said one of the second memory operation and the refresh operation is controlled with a signal for detecting a time for starting precharging a selected bit line for said later-in-time operation.

15. A semiconductor memory device comprising:

a memory array comprising a plurality of memory cells arranged to match a plurality of bit lines and a plurality of word lines and periodically needing a refresh operation to hold stored information;

a precharging circuit for precharging the bit lines;

an address selecting circuit for selecting a specific word line out of said plurality of word lines and a specific bit line out of said plurality of bit lines in accordance with an address signal; and a time-multiplexing control circuit for allocating time segments for:

a first memory operation to release said bit lines from the precharging circuit, and then either to read information in the memory cells or to write external information into the memory cells by selecting a first word line and a first bit line in accordance with a first memory operation address signal by the address selecting circuit, a first precharge operation by the precharging circuit to precharge said bit lines again, a refresh operation to release said bit lines from the precharging circuit again and to refresh in accordance with an refresh address signal, and refresh preparations including decoding the refresh address signal thereby selecting a second word line in accordance with the refresh address signal partially in parallel with the first memory operation or the first precharge operation, wherein, when a first memory operation on any of said memory cells to read stored information or to write information to be stored is instructed, said time-multiplexing control circuit allocates the refresh operation after the first memory operation and without overlapping the first precharge operation.

16. The semiconductor memory device according to claim 15, wherein the refresh operation is performed only when a refresh request is received in a time segment allocated for the refresh operation.

17. The semiconductor memory device according to claim 16, wherein said address selecting circuit comprises a first selecting circuit for decoding the first memory operation address signal thereby selecting the first word line, a second selecting circuit for decoding the refresh address signal thereby selecting the second word line, and a sector circuit for selecting either an output signal of said first selecting circuit or an input signal of said second selecting circuit to select a word line, and wherein said selecting circuit is switched on by a refresh request.

18. The semiconductor memory device according to claim 15, wherein said address selecting circuit comprises a first selecting circuit for decoding the first memory operation address signal thereby selecting the first word line, a second selecting circuit for decoding the refresh address signal thereby selecting the second word line, and a sector circuit for selecting either an output signal of said first selecting circuit or an input signal of said second selecting circuit to select a word line, and wherein said selecting circuit is switched on by a refresh request.

19. The semiconductor memory device according to claim 18, wherein the refresh address signal is formed by a refresh address generation circuit consisting of a counter circuit receiving periodic pulse signals.

20. A semiconductor memory device comprising:

a memory array including a plurality of memory cells arranged to match a plurality of bit lines and a plurality of word lines and periodically needing a refresh operation to hold stored information;

a precharging circuit for precharging the bit lines;

an address selecting circuit for selecting a specific word line out of said plurality of word lines and a specific bit line out of said plurality of bit lines in accordance with an address signal; and a time-multiplexing control circuit for allocating time segments for:

a refresh operation to release said bit lines from the precharging circuit in accordance with a refresh address signal, to select a first word line and a first bit line in accordance with the refresh address signal by the address selecting circuit, to read information stored in a corresponding memory cell onto the first bit line, and to amplify and rewrite the read information into the corresponding memory cell, a first precharge operation to precharge said bit lines again, a first memory operation to release said bit lines from the precharging circuit again, and to read information in the memory cells or to write information into the memory cells in accordance with a first memory operation address signal, and preparations for the first memory operation including decoding the refresh address signal thereby selecting a second word line in accordance with the first memory operation address signal partially in parallel with the refresh operation or the first precharge operation, wherein, when a first memory operation on any of said memory cells to read stored information or to write information to be stored is instructed, said time-multiplexing control circuit allocates the refresh operation before the first memory operation and without overlapping the first precharge operation.

21. The semiconductor memory device according to claim 20, wherein said address selecting circuit comprises a first selecting circuit for decoding the first memory operation address signal thereby selecting the first word line, a second selecting circuit for decoding the refresh address signal thereby selecting the second word line, and a sector circuit for selecting either an output signal of said first selecting circuit or an input signal of said second selecting circuit to select a word line, and wherein said selecting circuit is switched on by a refresh request.

22. The semiconductor memory device according to claim 20, wherein the refresh operation is performed only when a refresh request is received in a time segment allocated for the refresh operation.

23. The semiconductor memory device according to claim 22, wherein said address selecting circuit comprises a first selecting circuit for decoding the first memory operation address signal thereby selecting the first word line, a second selecting circuit for decoding the refresh address signal thereby selecting the second word line, and a sector circuit for selecting either an output signal of said first selecting circuit or an input signal of said second selecting circuit to select a word line, and wherein said selecting circuit is switched on by a refresh request.

* * * * *